(12) United States Patent
Kojima

(10) Patent No.: US 7,380,194 B2
(45) Date of Patent: *May 27, 2008

(54) DATA PROCESSING METHOD AND APPARATUS, RECORDING MEDIUM, REPRODUCING METHOD AND APPARATUS

(75) Inventor: Tadashi Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

This patent is subject to a terminal disclaimer.

(21) Appl. No.: 11/113,108

(22) Filed: Apr. 25, 2005

(65) Prior Publication Data

US 2005/0204270 A1 Sep. 15, 2005

Related U.S. Application Data

(62) Division of application No. 09/955,099, filed on Sep. 19, 2001, now Pat. No. 6,907,561.

(30) Foreign Application Priority Data

Nov. 8, 2000 (JP) ............... 2000-340820

(51) Int. Cl.
*H03M 13/00* (2006.01)
*G06F 11/00* (2006.01)

(52) U.S. Cl. ............... 714/752; 714/784; 714/701; 714/746

(58) Field of Classification Search ............... None
See application file for complete search history.

(56) References Cited

U.S. PATENT DOCUMENTS 4,393,502 A * 7/1983 Tanaka et al. ............... 714/755
5,790,569 A   8/1998 Kojima et al.
6,182,263 B1  1/2001 Kojima et al.
6,625,762 B1  9/2003 Le Dantec
6,684,361 B2  1/2004 Tong et al.
6,718,510 B2 * 4/2004 Kojima ............... 714/784

FOREIGN PATENT DOCUMENTS

| EP | 0 481 752   | 4/1992 |
|----|-------------|--------|
| EP | 0 766 245   | 4/1997 |
| EP | 1 182 785   | 2/2002 |
| JP | 09-091882   | 4/1997 |
| JP | 09-213020   | 8/1997 |
| JP | 10-172243   | 6/1998 |
| JP | 10-188489   | 7/1998 |
| JP | 2000-057700 | 2/2000 |

* cited by examiner

*Primary Examiner*—Phung M. Chung
(74) *Attorney, Agent, or Firm*—Oblon, Spivak, McClelland, Maier & Neustadt, P.C.

(57) ABSTRACT

A row of the data block which is a set of the data sector is distributed to constitute two blocks. In this case, as a distribution condition, an even-number row block of the even-number sector and the odd-number row block of the even-number sector, the odd-number row block of the even-number sector and an even-number row block of the even-number sector are obtained. Then, the block is aggregated in the transmission order, and an outer parity is scattered to each sector to form an interleaved form.

7 Claims, 16 Drawing Sheets

DATA PROCESSING METHOD AND APPARATUS, RECORDING MEDIUM, REPRODUCING METHOD AND APPARATUS

CROSS-REFERENCE TO RELATED APPLICATIONS

This application is a divisional of U.S. application Ser. No. 09/955,099, filed Sep. 19, 2001, now U.S. Pat. No. 6,907,561 and is based upon and claims the benefit of priority from the prior Japanese Patent Application No. 2000-340820, filed Nov. 8, 2000, the entire contents of each of which are incorporated herein by reference.

BACKGROUND OF THE INVENTION

1. Field of the Invention

The present invention relates to data processing method and apparatus, and recording medium for an error-correcting product code favorable for use in the recording and transmission of digital data.

More particularly, the present invention relates to a data processing system using an error-correcting product code which comprises a data section, an error-correcting outer parity and an error-correcting inner parity which are effective in the case where information data is recorded on a plurality of kinds of recording media particularly having a largely different recording density.

Here, particularly, in a method for forming the outer parity, a PO series created by n sets of data items aggregated by n rows is used. Consequently, even when the error-correcting product code block is recorded on a recording medium in an order of data transmission without carrying out data interleave process; the capability of coping with the defect is largely improved.

2. Description of the Related Art

In a system in which digital data is recorded on an optical disk in bytes (one byte is equal to eight bits) or digital data is transmitted to a transmission channel, a Reed-Solomon error-correcting product code block is conducted to process data. That is, (M×N) bytes of data is arranged in a matrix containing an M rows×N columns. Then, PO bytes error-correcting word is added to each column of M bytes information portion. Then, (M+Po) rows×(N+Pi) columns Reed-Solomon error-correcting product code block is conducted. Then, the Reed-Solomon error-correcting product code block having (M+N) rows×(N+Pi) columns is constructed.

Then, the Reed-Solomon error-correcting product code block is either recorded on a recording medium or transmitted to a transmission channel. The error correction processing portion and on the reproduction side of the recording media or on the receiving side of the transmission channel are capable of correcting random errors and burst errors on the information reproduction portion by using the error-correcting words PO and PI.

Such Reed-Solomon error-correcting product code block has a higher data processing efficiency with a decrease in a ratio of a redundant portion (Pi×M+Po×N+Po×Pi) of the error-correcting word with respect to the whole word referred to as a redundancy ratio, namely (M+Po)×(N+Pi). On the other hand, the error-correcting capability is also heightened with respect to the random error and the burst error with an increase in the Pi and Po.

Here, it is known that the Reed-Solomon error-correcting code block having small M and N, namely small Pi and Po has a lower correcting capability because of relatively higher probability of error in error correction in the case where the Reed-Solomon error-correcting product code blocks having the same redundancy ratio are compared with each other.

On the contrary, it is known that since Pi and Po can be increased at the same redundancy ratio with an increase in M and N, a high error-correcting capability can be obtained. However, such capability cannot be realized unless the constraint conditions described below are satisfied.

A first constraint condition is that M+Po and N+Pi must be equal to or less than 255 bytes as a code length for constructing the Reed-Solomon error-correcting product code block (in the case where the length of the code is eight bits). Incidentally, the Pi described above refers to the PI series error-correcting code length while Po refers to the PO series error-correcting code length.

A second constraint condition is a cost constraint resulting from the scale of the hardware.

By the way, when considered on the basis of the above conditions, optical disk standards such as a DVD-ROM, a DVD-RAM, a DVD-R or the like which are the information recording media in recent years are made public as a standard in which the improved Reed-Solomon error-correcting product code block is adopted. Out of these standards, the DVD-ROM and the DVD-RAM are established as DIS16448 (DVD-ROM having a diameter of 80 mm) and DIS16449 (DVD-ROM having a diameter of 120 mm) and DIS16825 (DVD-RAM).

In this DVD standard, the above idea is adopted with respect to the error-correcting word processing method so that the error-correcting capability is remarkably improved with error-correcting word having a small redundancy ratio as compared with the method used in the conventional optical disks.

The concept on the error-correcting method of the DVD is basically described above, the fundamental problem is to what level the target of the random error-correcting capability and the burst error-correcting capability is to be set. In order to set such level, the recording method of the recording medium and the generation of defects resulting from the handling thereof must be considered.

The recording/reproducing method is determined from the recording/reproducing beam spot size resulting from the recording wavelength and the optical system characteristic in the optical disk system. Here, the recording density constitutes a large factor in the determination of the error-correcting method. In the determination of the burst error correction capability, the defect length such as scratches or the like generated in the handling of the discs can be determined from experience. With respect to the error-correcting capability, the multiplication of line recording density by the physical defect length constitutes a burst error length of information data with the result that the error correcting capability is required to be raised in the improvement of the recording density.

The recording density can be described as follows with particular reference to the reproduction system.

When, a light source wavelength is denoted by $\lambda$, and a numeric aperture of an object lens is denoted by NA, the recording density stands proportional to $(NA/\lambda)^2$. The wavelength adopted in the DVD is 650 nm while NA is 0.6.

In the error-correcting method, a row side inner parity of RS (182, 172, 11) and a column side outer parity of RS (208, 192, and 17) are adopted by means of PI (inner parity)=10 bytes and PO (outer parity)=16 respectively with respect to the (M×N)=(192×172) bytes information data block in terms of the Reed-Solomon error-correcting product code (RS is referred to as Reed-Solomon). The block used in this error-correcting method is referred to as the error-correcting product code block.

Here, with respect to the error-correcting product code block, the error is corrected in the PI series a first, and an error mark is attached to a row whose error cannot be corrected. Thereafter, at the time of the error correction on the PO series, the error mark is treated as an error position. When the so-called "erasure correction" method for calculating and extracting only error patterns is used, a maximum of 16 rows of burst errors can be corrected. In the DVD, since the recording density is data bit length=0.267 µm, 0.000267×8×182×16=6.2 mm is given. It is possible to say that about 6 mm burst error-correcting capability is given.

However, as a next generation DVD an examination is started on an optical disk having a large capacity resulting from further increase in the density. For the further increase in capacity exceeding the DVD, the recording density must be increased. Recently, in order to meet such request, a blue laser diode having a wavelength of 450 nm is made public. When such laser diode is used, it is expected that the recording density can be improved by about 2.6 times in the optical system similar to the DVD or the like. With the improvement in the optical system, four to five times higher density can be realized so that a fine image such as a high definition image such as a Hi-Vision or the like can be recorded for two or more hours on one disc.

In such increase in the density (for example, the line density is about twice as compared with the conventional one), only about 3 mm error-correcting capability can be provided with respect to the burst error when the conventional error-correcting method is introduced.

Furthermore, as described above, the error-correcting word length is 255 bytes at most as long as 1 word=8 bit system processing system is used. Since the PO series is 208 bytes in the DVD standard, the burst error correcting capability is close to the limit in the above error-correcting method so that only little improvement can be expected.

In order to expand the error-correcting word length, the word length may only be lengthened. With respect to the word length, a multiple of eight can be easily used. As a consequence, 1 word=16 bits can be considered. The scale of the error-correcting circuit as hardware is extremely large as compared with the conventional one so that there arises many problems.

In such a case, there is generally available a technique in which the burst error-correcting capability is improved while maintaining the error-correcting code length by adopting a data interleave to scatter the burst error.

However, the data interleave is not adopted even in the DVD standard. The reason goes as follows: in the case where an error is created which exceeds the error-correcting capability in the reproduction processing in the case of an image signal in which information data is compressed, the error data is scattered with the result that a disadvantage of the reproduced image is generated at many positions. In the reproduction processing of the image signal, it is thought that processing of concentrating and reproducing disadvantageous images as much as possible is favorable as a processing of generated disadvantage. This is because the processing can be completed with the reproduction of an instant disadvantageous image.

Besides, a structure close to the current DVD system is favorable for the upper compatibility with respect to the next generation system.

Points Noted by the Inventors of the Present Invention

Generally, in the error-correcting processing method such as a package medium or the like, the Reed-Solomon product code block method is introduced in many cases. This is because high performance and high efficiency can be expected in the case where an error in the defect error data can be detected and corrected such as a defect generated in the package media in the manufacture and distribution thereof.

With respect to the unit of the processed data, 1 word=1 byte (8 bits) is favorable. When the application development of the system is considered, it is required to suppress a processing circuit to an appropriate hardware scale. Besides, this fact is also required for facilitating a connection to the recording medium and transmission channel because a front and rear processing circuit is provided in the recording on the recording medium and data transmission to the transmission channel in addition to the error-correcting processing.

Under the circumstances, use of the Reed-Solomon error-correcting product code block used in the current DVD is optimal as an error-correcting method which can correspond to a large improvement in the recording density of the recording medium.

row side inner parity RS (182, 172, 11)

column side outer parity RS (208, 192, 17)

However, the problem is that it is required to settle the improvement of the burst error correction capability.

BRIEF SUMMARY OF THE INVENTION

Therefore, an object of the present invention is to provide a data processing method and apparatus and a reproducing method and apparatus which can largely improve a burst error-correcting capability even in a correction flag redundancy ratio which is the same as the conventional one in an error-correcting method cased on byte data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiment of the invention, and together with the general description given above and the detailed description of the embodiment given below, serve to explain the principles of the invention.

DETAILED DESCRIPTION OF THE INVENTION

Figure 1:
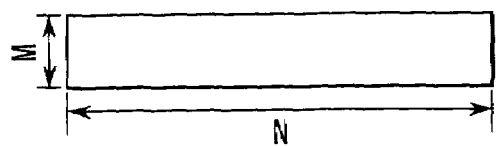
FIG. 1 is a view showing a (M×N) byte information block.

Hereinafter, referring to the accompanying drawings, embodiments of the present invention will be explained in detail.

In a structure of an error-correcting inspection information data block in which an error-correcting code is created and added to an information data block, the Reed-Solomon error correction is used for heightening the random error and burst error correction capability. Furthermore, generally, in the digital data processing, a unit of 8 bits constitutes one byte. In consideration of other aspects of the development, such concept is favorable in the data processing efficiency.

Hereinafter, a detailed explanation will be given by referring to the drawings and the DVD standard.

FIG. 1 is an M row×N columns information data block. In the field of computers, 128×(multiple of 2) is used as processed information data block.

In the DVD standard, 2048 bytes are used as an information block unit. By adding ID and a control code or the like to 2048 bytes main data, 2064 bytes is set to constitute 12 rows×172 columns information data block. When an attempt is made to gain an expected error-correcting capability by directly adding an error-correcting code to (M×N=12×172) bytes block, the redundancy ratio of the correction code becomes too high. Then, (K×(M×N)) bytes information data block is constructed by aggregating K information data blocks.

Figure 2:
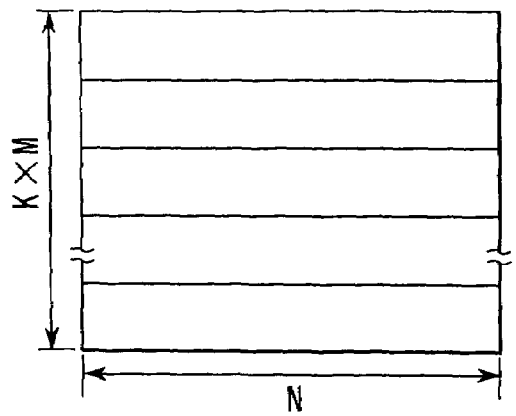
FIG. 2 is a view showing a (K×(M×N)) structure when k pieces of the (M×N) bytes information blocks are aggregated.

FIG. 2 is a view showing this (K×(M×N)) bytes information data block. In the DVD standard, K=16 is adopted.

The row (vertical) direction in the information data block is the (K×M) bytes data. In the (K×M) bytes data in each of the N rows, (K×Q) bytes error-correcting code is created and added. Next, the row (vertical) direction in the information data block of FIG. 2 is N bytes data. Furthermore, the row number is (K×M)+(K×Q) row because of an increase in the previous error-correcting code (K×Q). In each of the (K×M)+(K×Q) row, P bytes which are error-correcting code is created and added.

Figure 3:
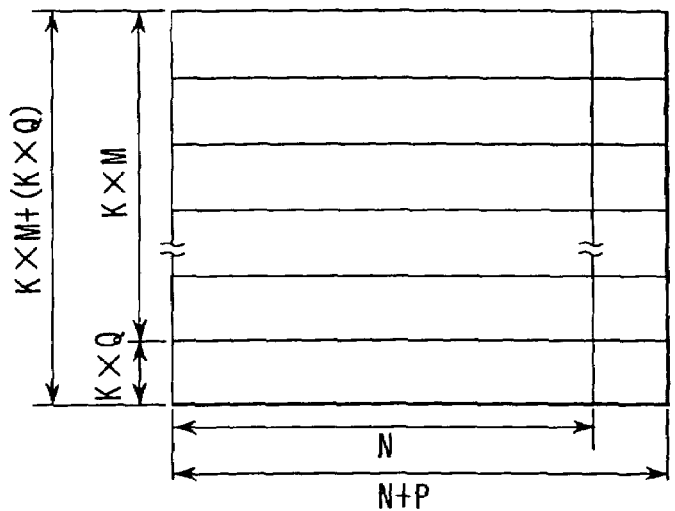
FIG. 3 is a view showing a correction block structure in which an error-correcting code is added to the (K×(M×N)) in a product code structure.

FIG. 3 is a view showing a state in which (K×Q) bytes error-correcting code and P byes error-correcting code are added to (K×(M×N) information data blocks.

In the DVD standard, Q=1 and P=10 are given.

Next, (K×Q) bytes error-correcting code is scattered by Q bytes and is added to K (M×N) bytes information data blocks respectively so that each of the information data blocks assumes the same configuration.

The processing is significant in that all the K information data blocks are formed in the same structure. That is, the ID showing an address of the information data is added to (N×M) bytes information data. However, since the error-correcting code (K×Q×172) which is an outer parity PO is all error-correcting code, the ID cannot be added thereto. Then, this error-correcting code is scattered and arranged in each information data block, so that all the information data blocks assume the same structure and have the ID.

Incidentally, the order of scattered arrangement order is such that after an error correcting inspection code in the row (vertical) direction is created, (K×Q) row is scattered to be arranged on each of the information data blocks. Otherwise, after an error-correcting code in the row (horizontal) direction is created and added to each row, the error-correcting code in the column (horizontal) direction is created and added to each row, the error-correcting codes of (K×Q) rows in the row (vertical) direction are scattered and arranged on each information data block. In any order, the method of the DVD standard yields the same result.

Figure 4:
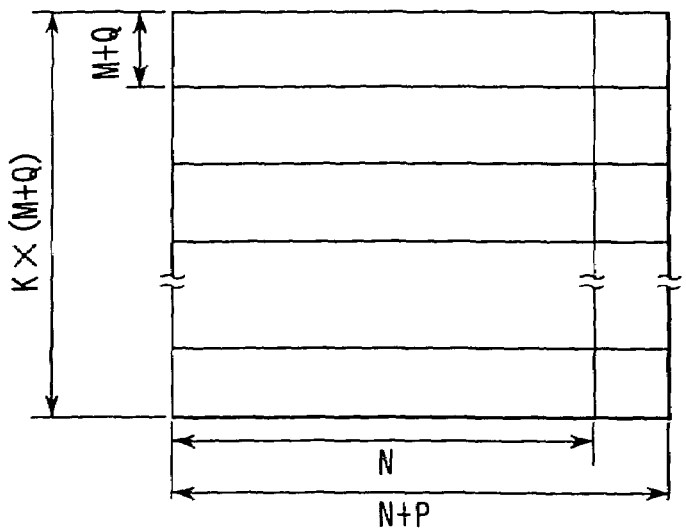
FIG. 4 is a view showing an error block structure in which an error-correcting inspection word PO (K×Q) is scattered to each information data block in Q bytes so that the information data block added with a correction flag-has the same structure.

FIG. 4 is a view showing a new block structure in which (K×Q) rows of the error-correcting words are scattered and arranged in each of K information data blocks by Q. In the DVD standard, (K×(N+1)×(N+P)), namely, [16×(208×182)] bytes error word block is constructed.

Figure 5:
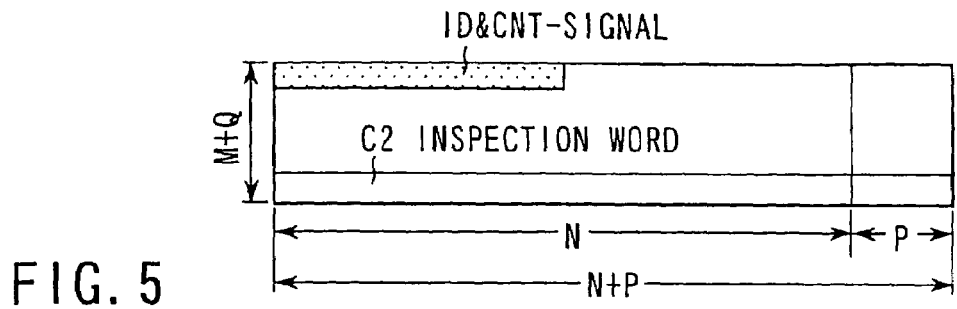
FIG. 5 is a view showing a structure of the information data block added with the error correction code of FIG. 4.

FIG. 5 is a view showing a structure of one information data block (M+Q)×(N+P) to which the error-correcting code is added. On the front row, an ID an a control signal (CNT-sig) which constitute address information of the information data block is arranged while the error-correcting word Q in the row (vertical) direction is arranged at the end row. In the DVD standard, Q=1 is set, and in this structure, the number of K can be increased until K×(M+Q) becomes 255.

Figure 6:
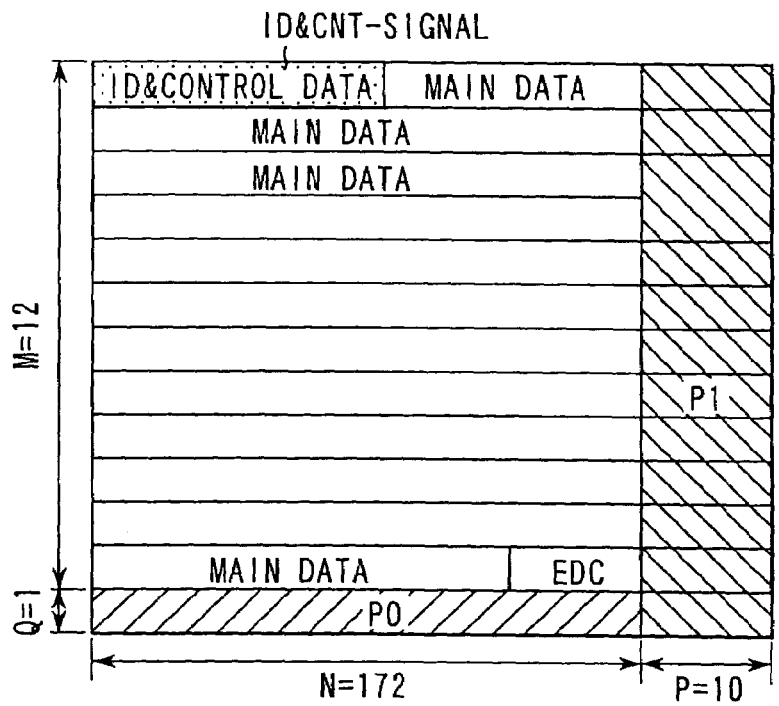
FIG. 6 is a view in which a structure of the information data block of FIG. 5 is shown in the code length used in the DVD standard.

FIG. 6 is a view showing in detail the information data block of FIG. 5. At the last of the main data, the EDC is added.

Figure 7:
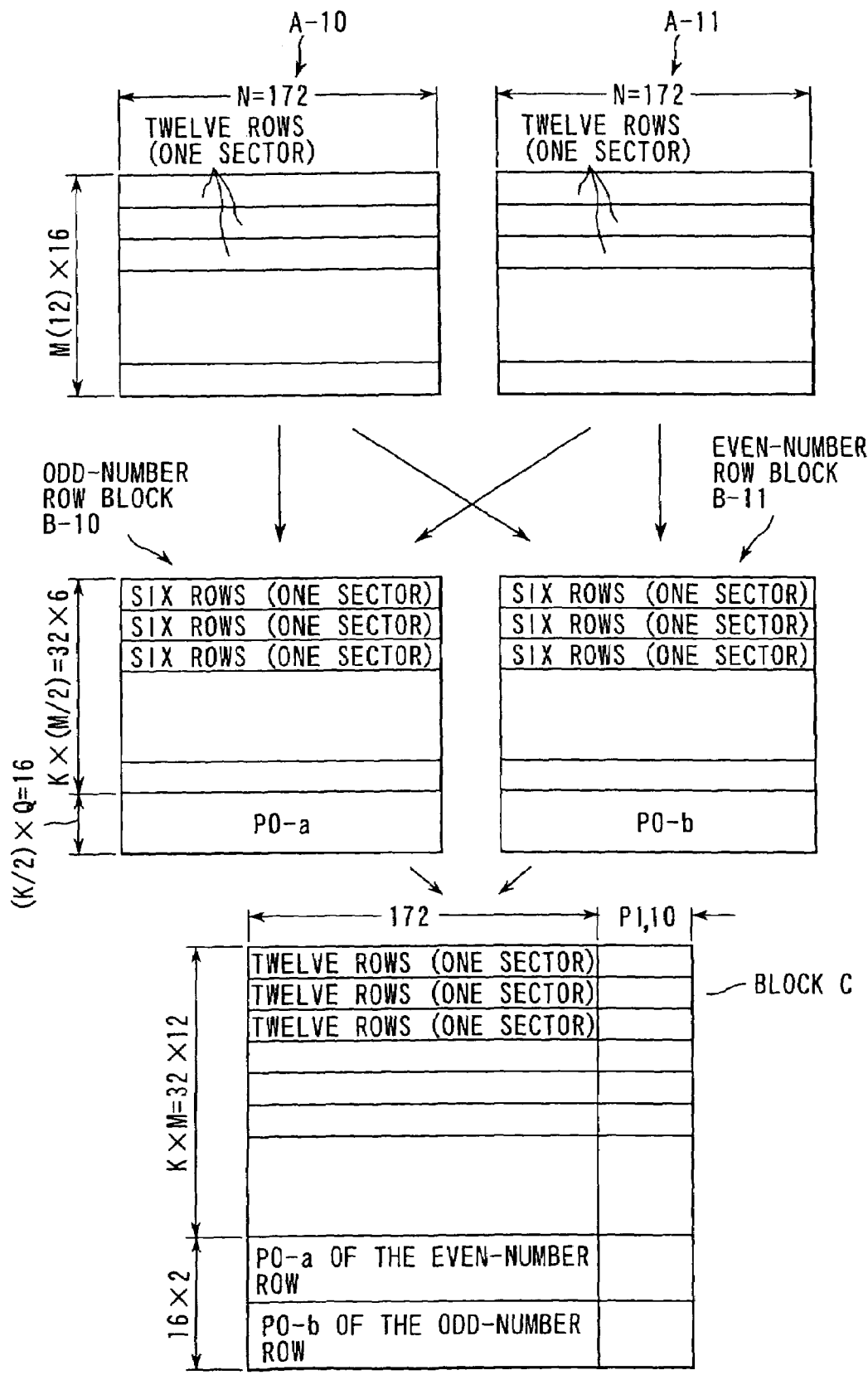
FIG. 7 is a view showing an example of a process at the time of creating an error-correcting block according to the present invention.

FIG. 7 is a view showing one embodiment of the information data block according to the present invention.

An aim of the present invention is to improve error-correcting capabilities in the case where a burst error is generated. For this purpose, the error-correcting processing block by the outer parity is scattered. For this purpose, a parity is added in the unit of 64K bytes. Then, an outer parity is added by 32K bytes.

In an explanation of FIGS. 1 and 2, K (however, here K=16 is set) information data blocks (N×M bytes) are aggregated. Then, in this set data block, an outer parity and an inner parity are added to create an ECC block. However, in this invention, two set information data blocks are added to create an ECC block. Consequently, the number k of the information data blocks which is to be handled is 32 according to the present invention.

FIG. 7 is a view showing a state in which two set information data blocks (A-10, A-11) are created. Next, the even-number row and the odd-number row of each of the set data blocks (A-10 and A-11) to provide two blocks respectively. Here, two blocks are assumed as even-number rows (B-10), (B-11). Next, an outer parity is respectively added and created to the even-number row block and the even-number row block. Hereinafter, an outer parity added to the even-number row block (B-10) is set as PO-a while an outer parity added to the odd-number row block (B-11) is set as PO-b. The outer parities PO-a and PO-b are also referred to as either an error-correcting inspection code or an error-correcting inspection word.

Here, as byte numbers of the outer parities PO-a and PO-b, (K×Q) bytes or (K/2×Q) bytes is created with respect to (K×M/2) bytes data on each column of the even-number row. Furthermore, as the byte number of PO-b, (K×Q) bytes or ((K/2)×Q) bytes is created with respect to (K×M/2) bytes data on each column of the odd-number row.

Next, the odd-number row and the even-number row which are separated are brought back to the form. This state is shown as a block C. Consequently, in the block C, 32 information data blocks (N columns×M rows) are aggregated. Furthermore, as an outer parity, PO-a and PO-b are added. Furthermore, an inner parity PI (10 bytes) is created and added. Next, PO-a and PO-b created here are scattered and arranged in the K(=32) information data blocks each having (M×N) bytes.

Figure 8:
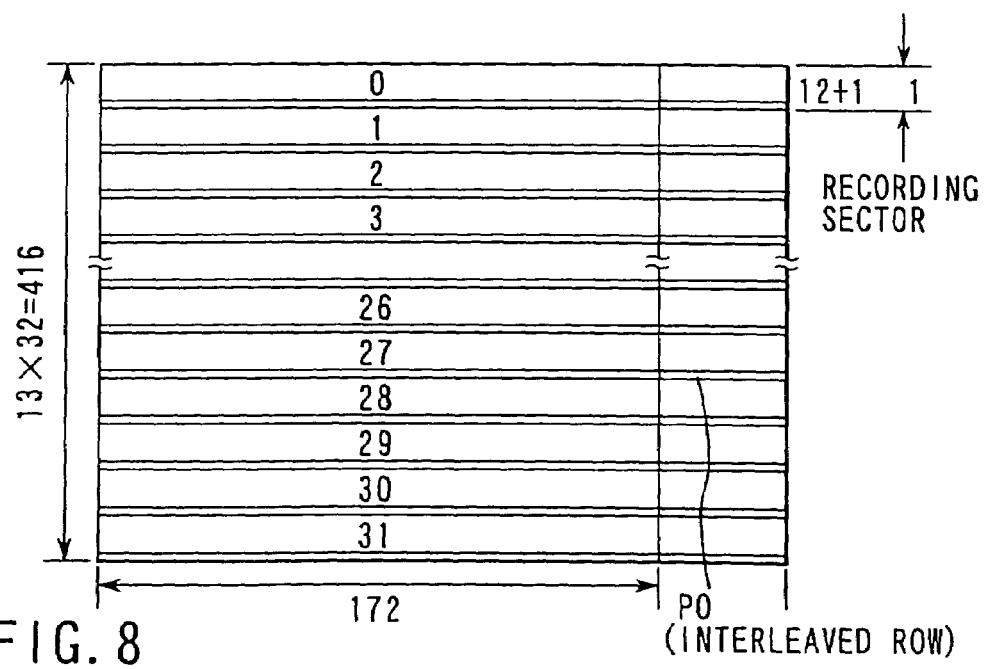
FIG. 8 is a view showing a state in which the error-correcting word PO is scattered and arranged on each information data block of the error-correction block according to the present invention.

FIG. 8 is a view showing a state in which an outer parity PO is scattered and arranged in each information data block. Here, in the case of PO-a=PO-b=(K×Q), PO-a and PO-b are respectively scattered and arranged to each (M×N) bytes information data block by Q bytes. In the case of PO-a=PO-b=((K/2)×Q), PO-a is scattered and arranged in the odd-number-th information data block or a first half of the information data block of K information data blocks.

Figure 9A:
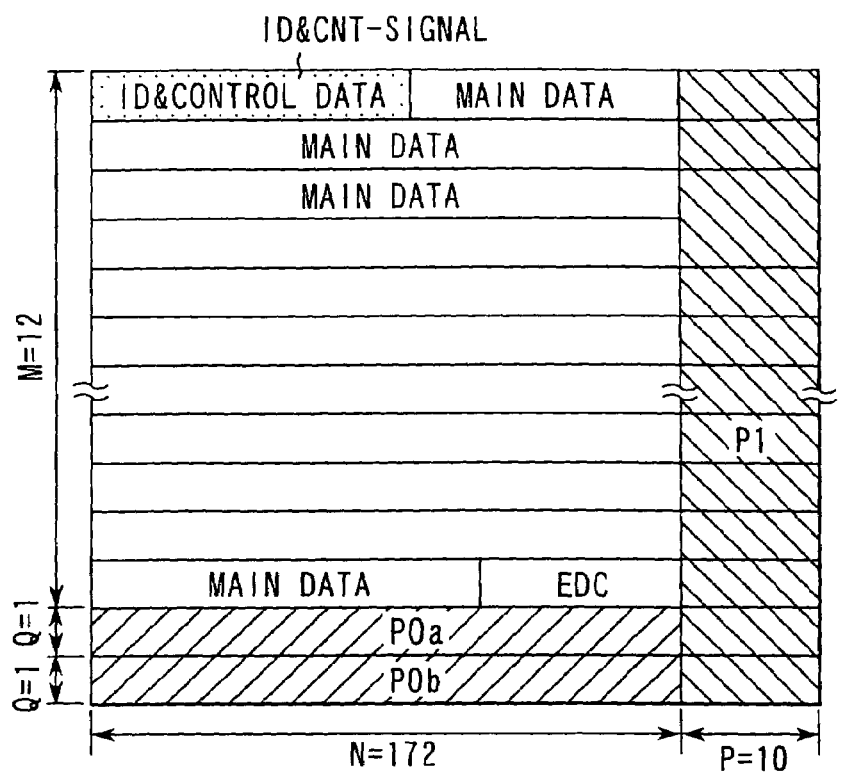
FIGS. 9A and 9B are views showing an example in which error-correcting inspection words PO-a and PO-b are arranged on the (M×N) bytes information data block according to the present invention.
Figure 9B:
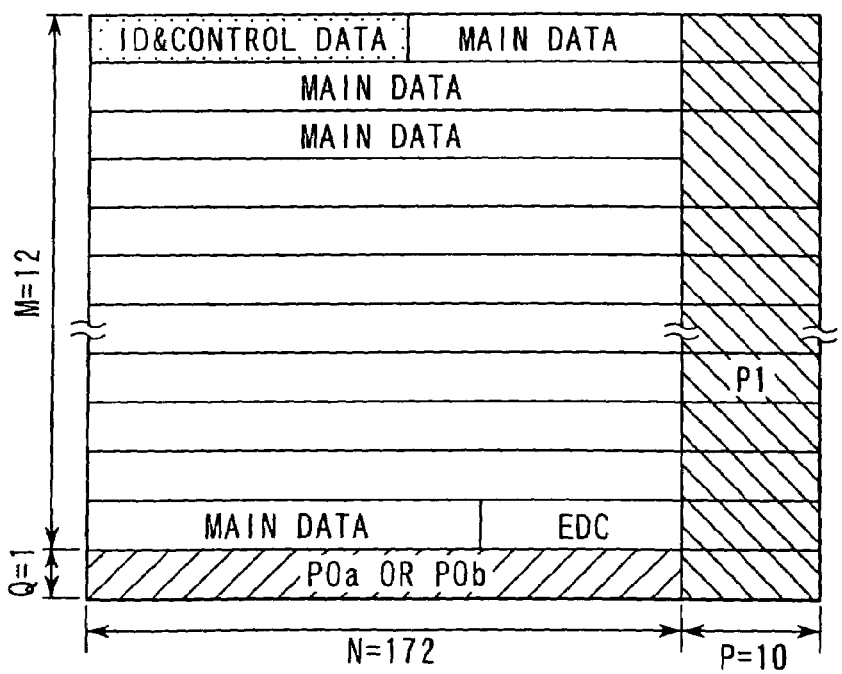

FIG. 9A is a view showing a state in which one information data block is taken out after PO is scattered and arranged in the case of the PO-a=PO-b=(K×Q). Furthermore, FIG. 9B is a view showing a state in which one information data block is taken out after PO is scattered and arranged in the case of PO-a=PO-b=((K/2)×Q).

The above ECC block shown in FIG. 8 is recorded on a recording medium from the front recording sector in order. Furthermore, in the transmission system, the ECC block is transmitted in order from the front recording sector. On the reproduction side and on the receiving side, the ECC block is incorporated into a buffer memory in order from the front. In the case where the ECC block of the unit shown in FIG. 8 is error corrected, the ECC block is restored into a form of odd-number row block B-10 and the even number-h block B-11 so that PO series error correcting processing is executed. As a consequence, even when a burst error is generated at the stage of the ECC block, the ECC block is scattered into the even-number row block and the odd-number row block, the error correcting capability can be raised.

Figure 10:
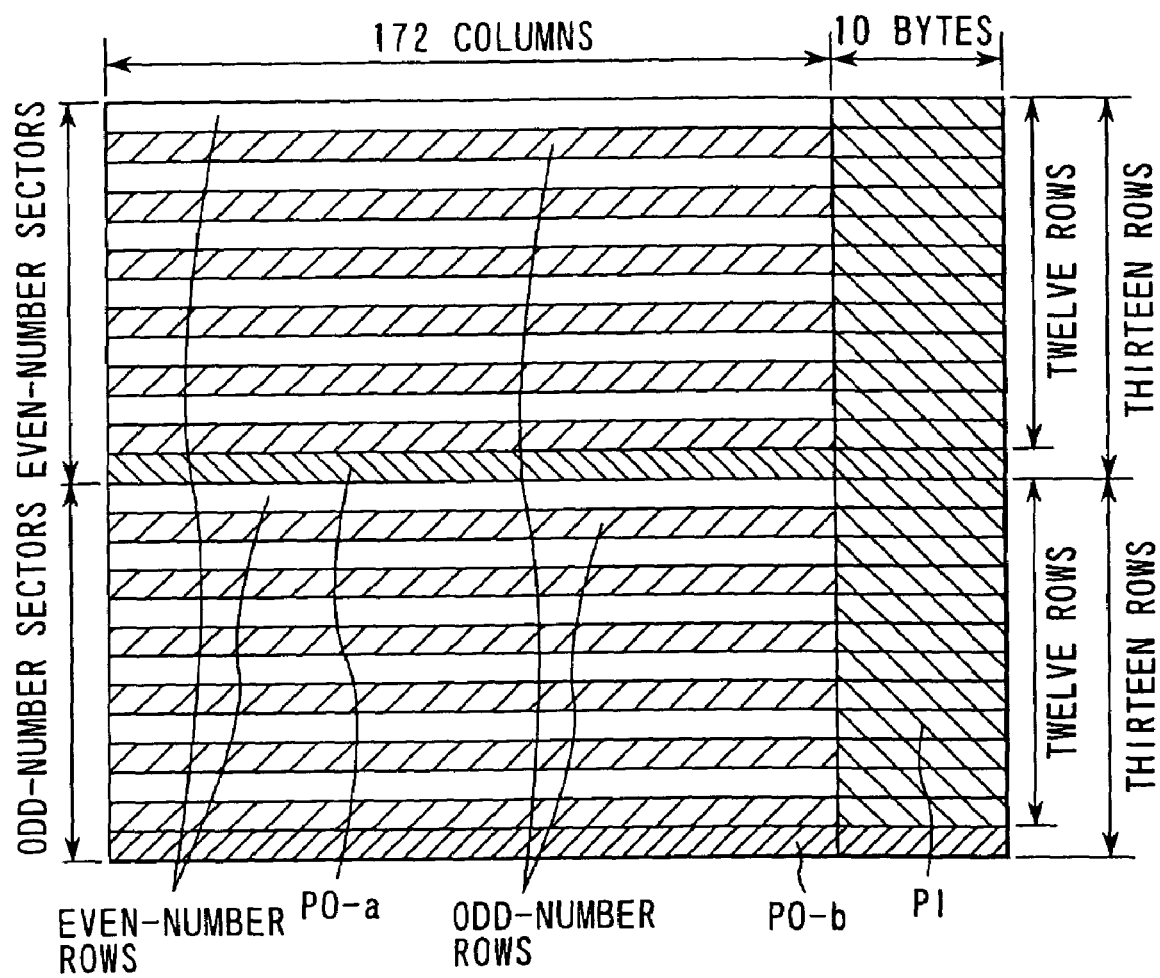
FIG. 10 is an explanatory view showing a sector linkage portion, the view being shown for explaining a problem at the time when an error-correcting block is structured with the method shown in FIG. 7.

Here, the invention pays attention to the point described below, thereby further improving an error-correcting capability FIG. 10 is a view shown for explaining the point to note of the present invention.

In the above embodiments, the even-number row and the odd-number row of two set information data blocks are simply separated to create a PO series codes (PO-a and PO-b) corresponding to the even-number row block and the even-number row block. Next, the even-number row block and the odd-number row block are brought back to the arrangement (the state in which the even-number rows and the odd-number row are arranged in an alternate manner) so that the PO series code as shown in FIGS. 9A and 9B are scattered and arranged. As a consequence, the ECC block as shown in FIG. 8 is created.

Here, the PO series code is arranged in Q bytes between sectors. Here, a linkage between the sector (the even-number sector) and the sector (the odd-number sector) is noted (in this example, the sector includes 12 rows information data block). Then, on the last row of the first sector, a part of the PO-a created by using the even-number row block (Q bytes×(N+P)) is located and the front row of the second sector becomes an even-number row. Consequently, the front row of the second sector (the even-number row) is present in the even-number row block.

As a consequence, as seen from the PO series, the PO series data is arranged for two line portions. Originally, an object of the present invention is to create an arrangement of each row as a repetition of add-numbers and even-numbers while the error correcting inspection word is created corresponding to the odd-number row block and the even-number row block respectively. As a consequence, when an error-correction time is conducted, the odd-number row block and the even-number row block are separated so that the error-correction processing is enabled in respective blocks. Consequently, the present invention is intended to scatter the error even at the time of the generation separated PO a creation block (E-10) and PO-b creation block are brought back to the original state and the even-number block and the odd number block are linked in order.

However, as has been explained in FIG. 10, when the same PO series data is arranged in two consecutive rows, the error scattering cannot be obtained as expected when the burst error is generated in this portion.

Therefore, in the present invention which has been further improved, the previous even-number row block and the odd-number row block are not obtained, so that the following PO-a creation blocks and PO-b creation blocks are obtained. That is, by referring to FIG. 11, the two blocks will be explained.

Figure 11:
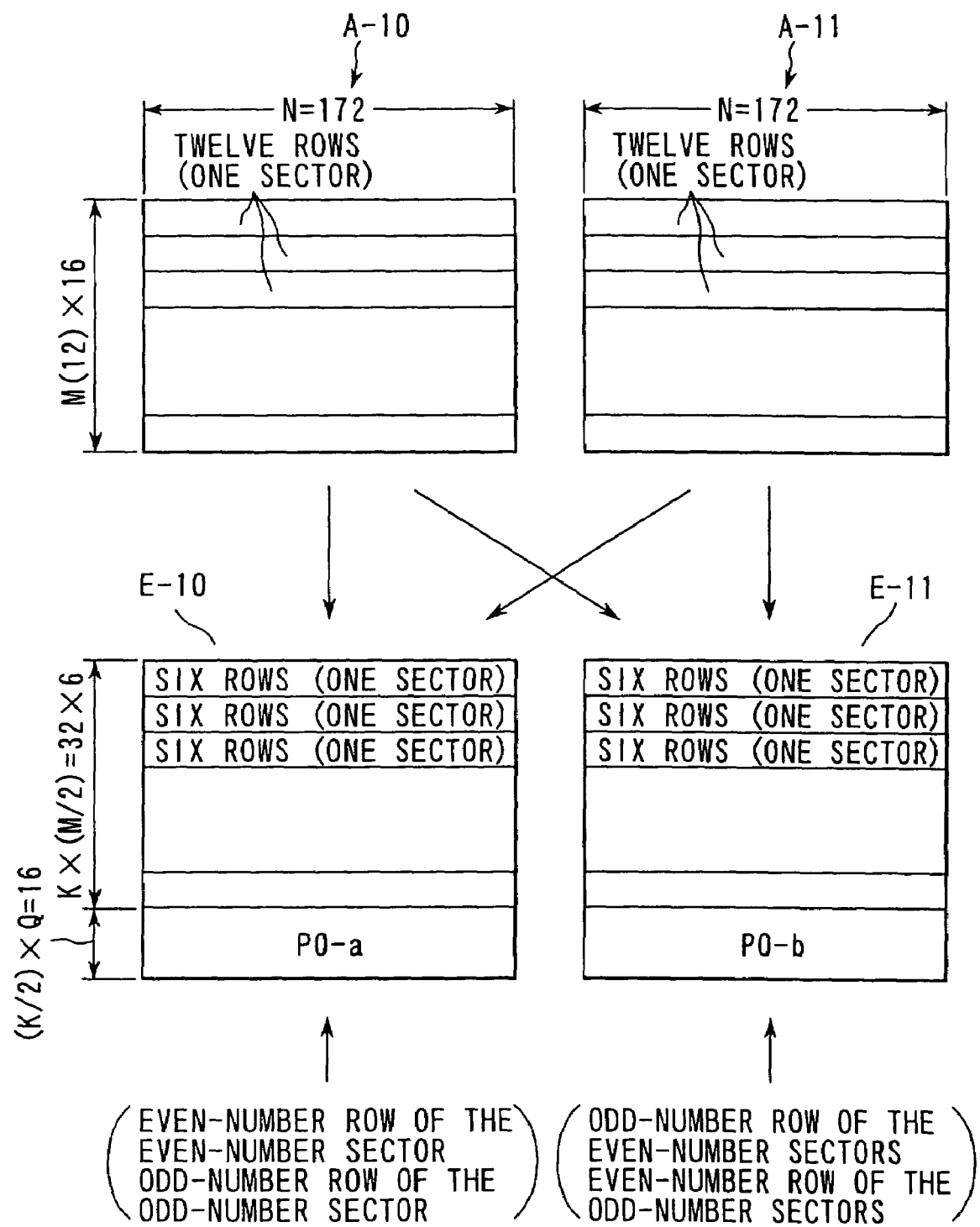
FIG. 11 is a view showing one example of a process at the time of creating the error-correcting block according to the present invention in the case where the error-correcting capability is further raised.

As shown in FIG. 11, use of the two set information data blocks (A-10 and A-11) which constitute the data transmission order is the same as the previous example.

Here, in the PO-a creation block (E-10), the even-number row in the even-number sector and the odd-number row of the odd sector are aggregated and created from the two set information data blocks (A-10 and A-11). Furthermore, in the PO-b creation block (E-11), the even-number row in the even-number sector and the odd-number row in the odd-number sector are aggregated and created from two set information data blocks (A-10 and A-11).

Figure 12:
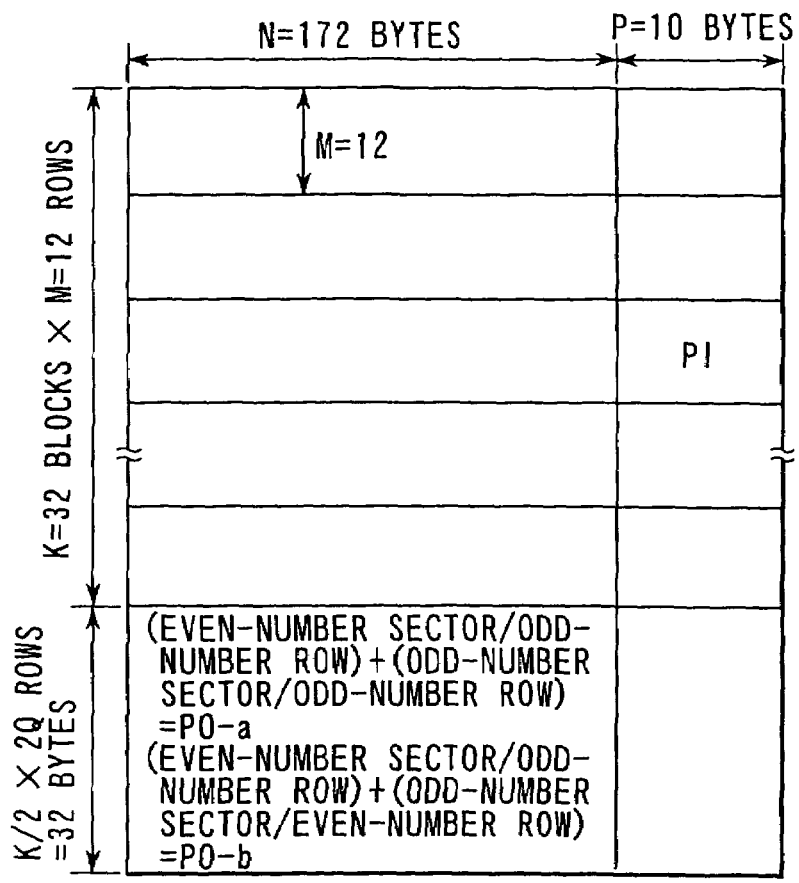
FIG. 12 is an explanatory view showing a block in the midst of the creation of the error-correcting block in which the error-correcting code capability is improved.

FIG. 12 is a view showing a state in which the even-number row and the odd-number row of the above separated PO-a creation block (E-10) and PO-b creation block (E-11) are brought back to the original state, and the even-number row block and the odd-number row block are linked in order. In this block F, 32 information data blocks (N columns×M rows) are aggregated. Further, as the outer parity, PO-a and PO-b are added thereto. Furthermore, the inner parity PI (10 bytes) are also added thereto. Next, PO-a and PO-b created here are scattered and arranged in K(=32) (M×N) bytes information data blocks to information data blocks each having (M×N) bytes. As a consequence, the PO series code is arranged by Q bytes between the respective sectors.

Figure 13:
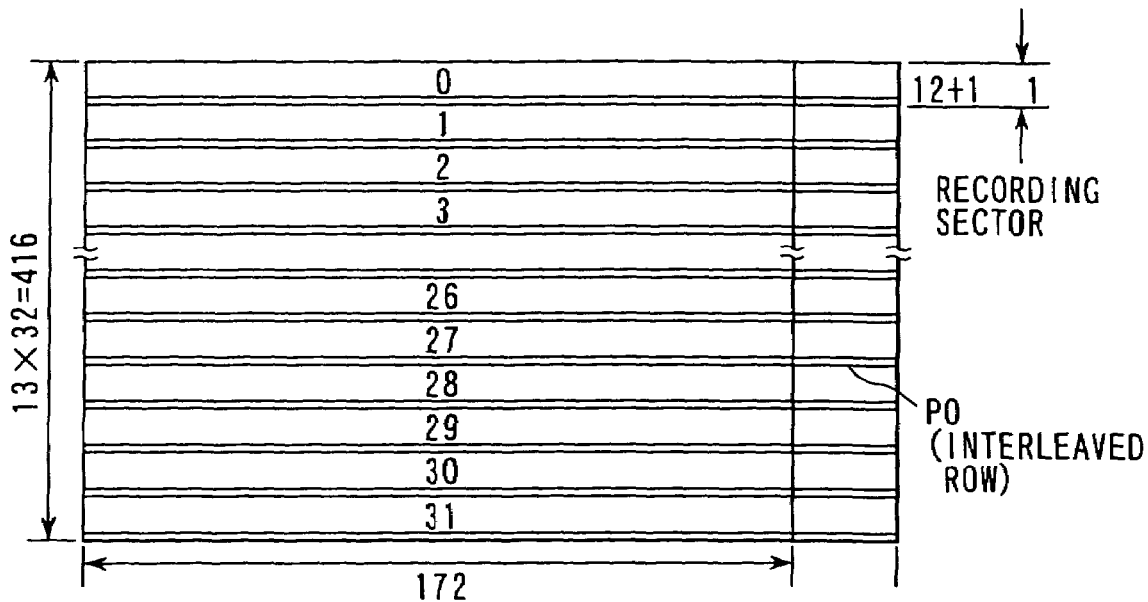
FIG. 13 is a view showing a state in which the error-correcting inspection word PO is scattered and arranged in each of the information data block in which the error-correcting capability of the present invention is improved.

FIG. 13 is a view showing the ECC block at this time. A method for scattering and arranging the PO series code has been explained in FIGS. 9A and 9B.

Figure 14:
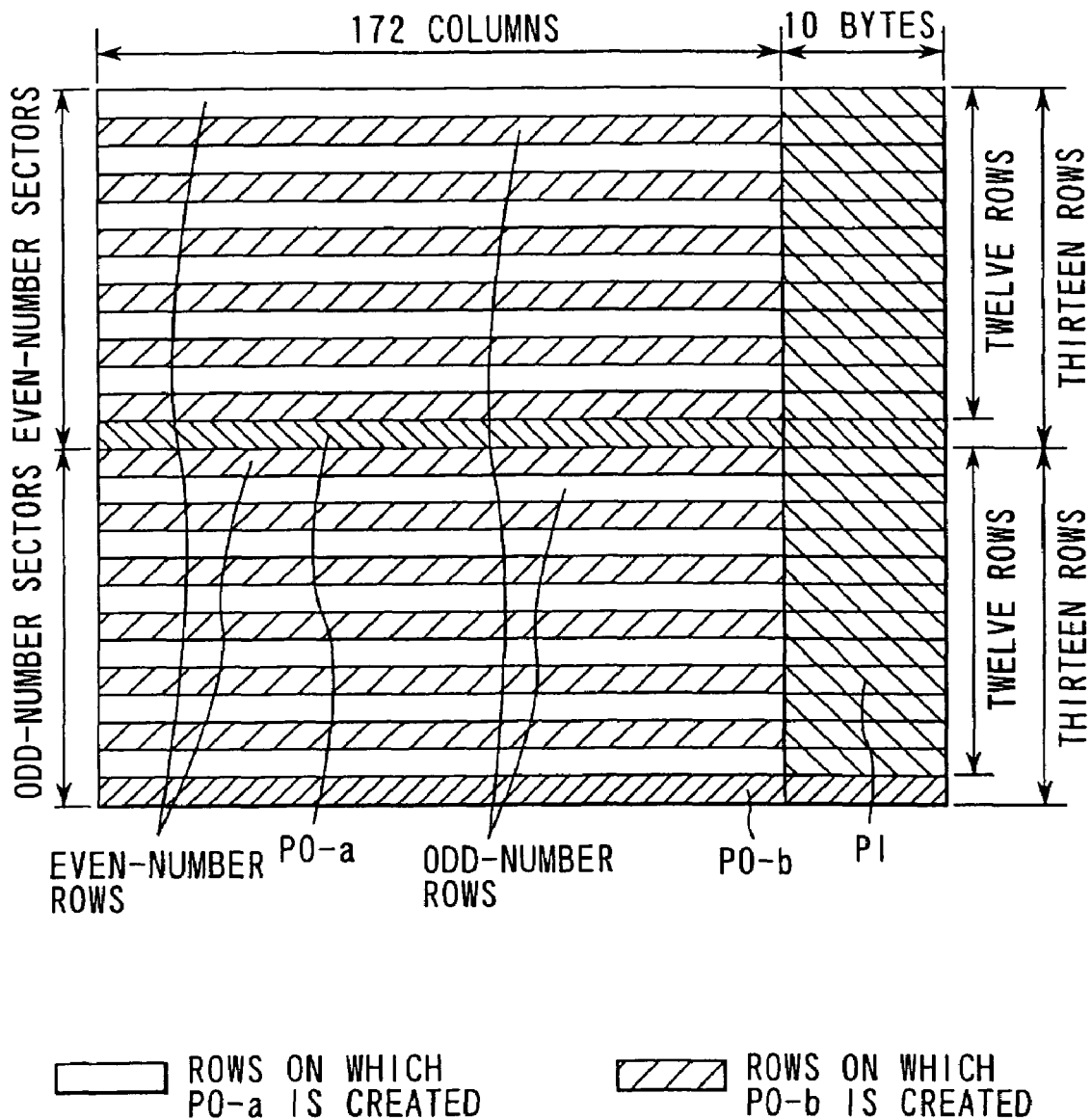
FIG. 14 is an explanatory view showing a sector linkage portion at the time when the error-correcting block is structured with the method shown in FIGS. 11 and 12.

FIG. 14 is a view showing a state in which a linkage between the sector (the even-number sector) and the sector (the odd-number sector) in the ECC block is noted. (In this example, the sector includes 12 rows information data blocks). Then, on the final line of the first sector, a part (Q bytes×(N+P)) of the PO-a created by using the block E-10 is located, and the front row of the second sector is the even-number sector while the even-number row of the odd-number sector is the PO-b as explained in FIG. 11. As a consequence, the row at the linkage between the odd-number sector and the even-number sector is in a state in which the row at the PO-a series and the row at the PO-b series are arranged in an alternate manner.

Consequently, an aim of the present invention is to effectively attain an object of forming the ECC block in which the PO-a series row and the PO-b series row are arranged in an alternate manner as aimed in the present invention, and improving error correcting capabilities with respect to the burst error. That is, burst error correcting capabilities having twice as long as code length as compared with the conventional method is provided by using the ECC block which is constituted in this manner.

The above embodiment is a case in which the row number of one sector is M=12 (even number). Here, there is considered a case in which M is an odd number (for example, 11).

Now, in the same manner as the above embodiment, the PO-a creation block (E-10) and P-b creation block (E-11) are created to set a state in which PO-a and PO-b are created with respect to respective blocks. Then, each row of the PO-a creation block.(E-10) and the PO-b creation block (E-11) are brought back to the original position. Furthermore, the PO-a and PO-b are scattered and arranged to create the ECC block.

Figure 15:
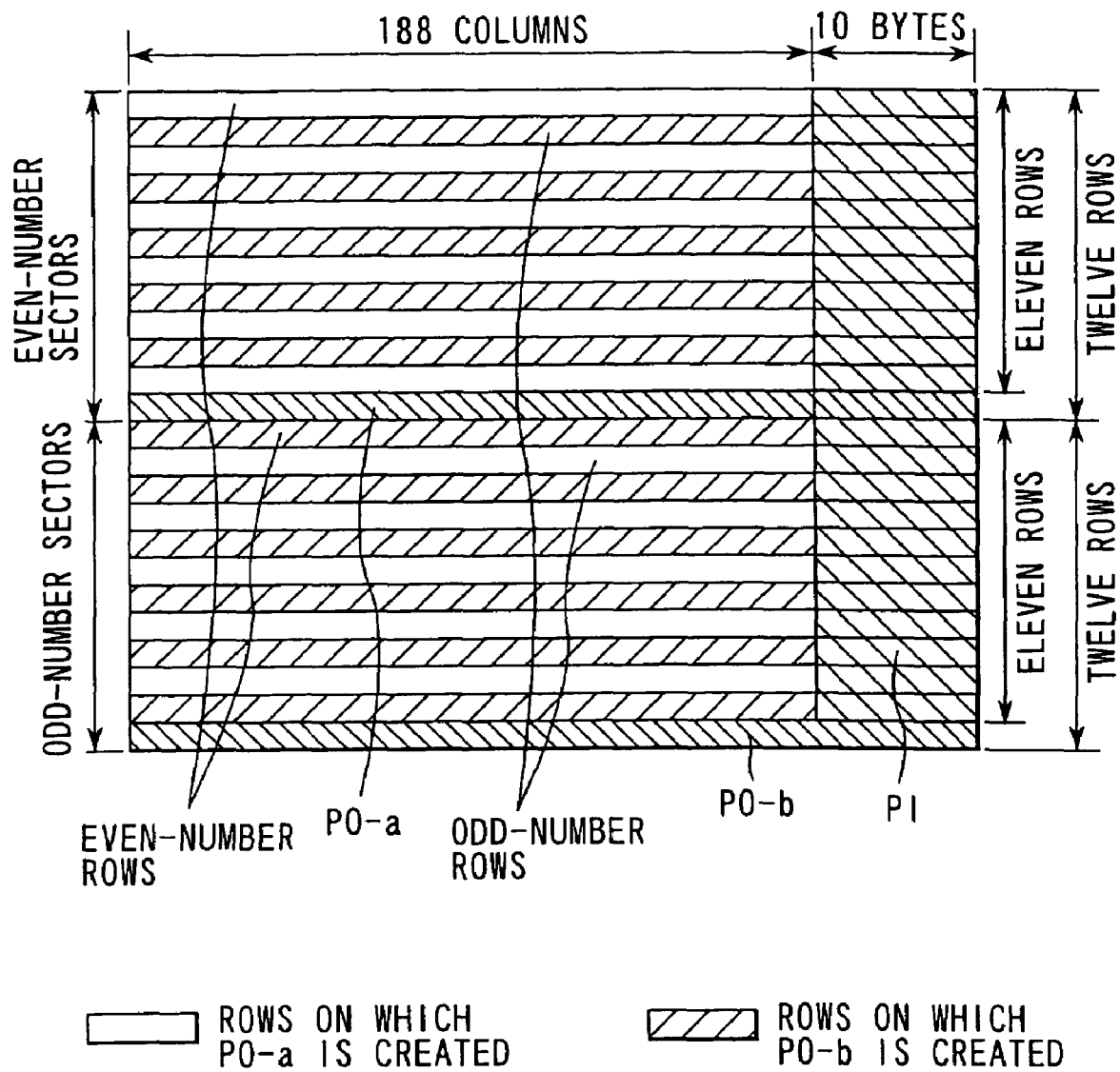
FIG. 15 is a view for explaining a sector linkage portion at the time when the error-correcting block is structured with the method shown in FIGS. 11 and 12 and an advantage of the present invention.

FIG. 15 is a view showing a state in which a linkage between the sector (even-number sector) and the sector (odd-number sector) in this ECC block. (In this example, the sector includes 12 rows information data block.) Then, on the last row (odd number row) of the first sector, a part (Q bytes×(N+P)) of the PO-a created by using the block E-10 is located. The front row of the second sector becomes an odd number row. The front row of the second sector is an even number. As explained in FIG. 11, the row of the PO-b series which belongs to the block E-11 is located.

As a consequence, the last row of the first sector and the row before the last row by two rows provide the row of PO-a series. As a consequence, in the case where a burst error is generated in this portion, the error correcting capability cannot be sufficiently displayed. However, there is present an example in which even when one sector is the odd-number row, an effect of the present invention can be sufficiently obtained.

Figure 16:
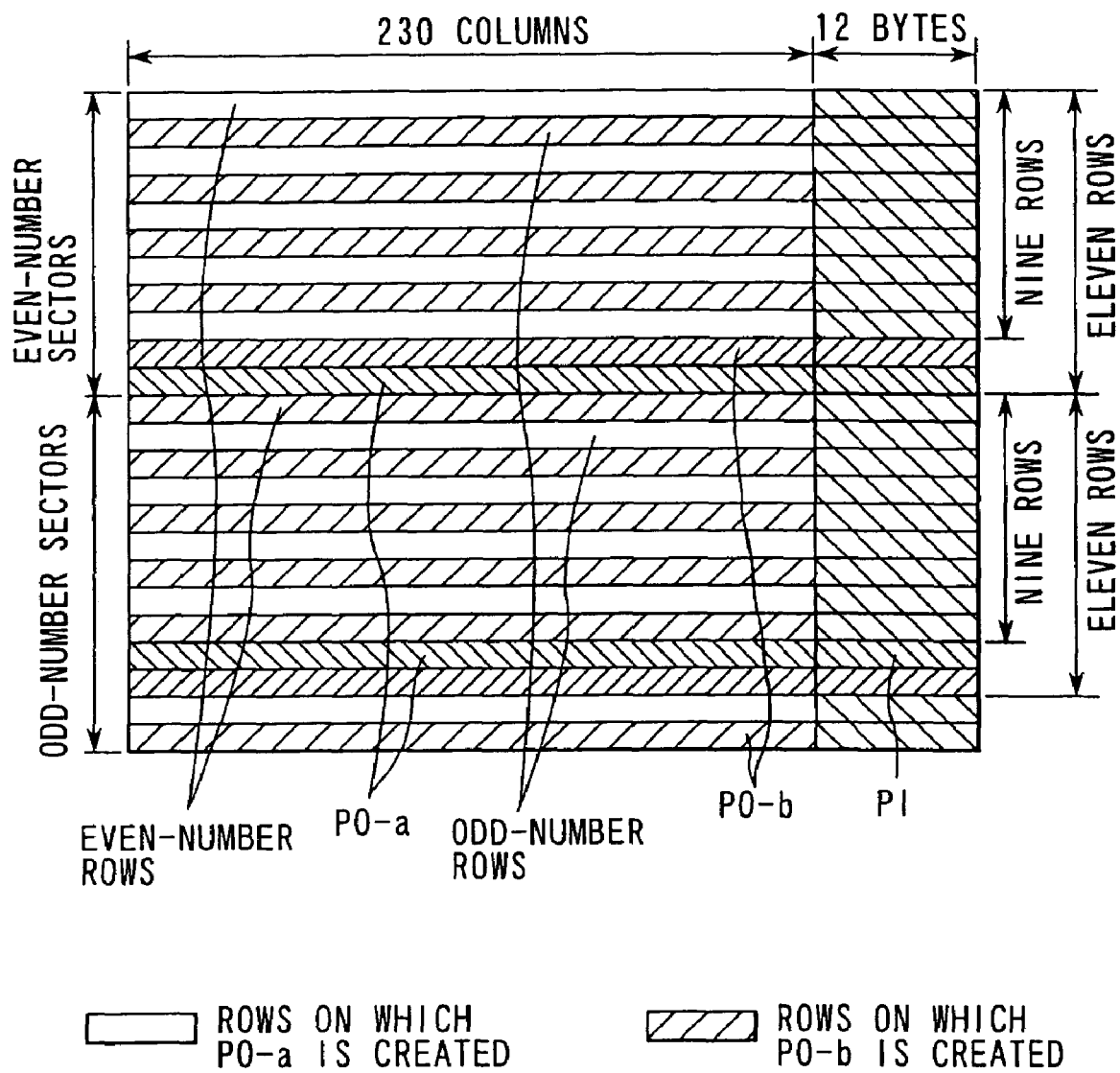
FIG. 16 is a view for explaining a sector linkage portion of an error-correcting block which is created in another embodiment of the present invention.

FIG. 16 is a view showing a state in which M=9 rows is adopted as a sector, and a method explained in FIG. 9A is used as an arrangement method. In this example, the following row arrangement is provided at the linkage of the sector. In the beginning, look at the linkage at a portion where the odd-number row is arranged next to the even-number sector. The last row as the information data block of the even-number sector is an even number, and the PO-b series error correcting inspection code is added to this last row by one row.

Furthermore, after the error correcting inspection code of the PO-b series, the PO-b series error correcting inspection code is added by one row. Here, the front row of the odd-number sector is an even-number row. This even-number row is used for preparing the PO-b series code as shown in the block E-11 of FIG. 11. Consequently, at the linkage portion between the even-number sector and the odd-number sector, PO-b and PO-a are arranged in an alternate manner.

Next, look at a linkage portion where the even-number sector is arranged next to the odd-number sector. The last row as the information data block of the odd-number sector is an even number, and this row is separated to the block E-11 of FIG. 11. Consequently, this row belongs to the PO-b series. In contrast, the error correcting inspection code of the PO-b series is added to this last row by one row. Next, after the error correcting inspection code of this PO-a series, one row of the error correcting inspection code of the PO-b series is arranged. The front row of the next odd-number sector is an even number. The front row is separated into the block E-10 shown in FIG. 11. In this case, this front row belongs to the PO-a series. As a consequence, at the linkage portion between the odd-number sector and the even-number sector, PO-a, PO-b, PO-a series rows are arranged in an alternate manner.

That is, in the embodiment of FIG. 16, when the error correcting code inspection codes PO-a and PO-b are scattered and arranged, the selection order is devised, and the Po-b, PO-a, PO-b and PO-a series rows are alternately arranged.

The concept of the embodiment of FIG. 16 can be applied to the case in which one sector is the even number row (for example, M=10).

Figure 17:
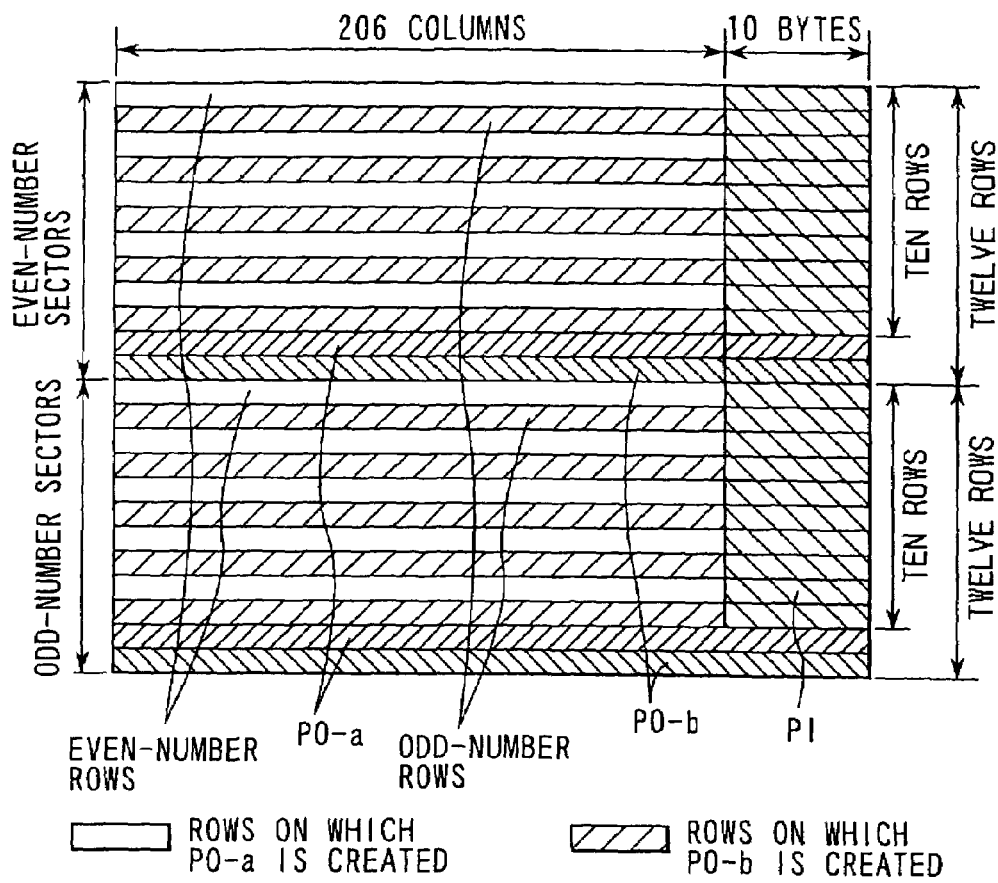
FIG. 17 is a view for explaining a sector linkage portion of an error-correcting block which is created in still another embodiment of the present invention.

FIG. 17 is a view showing a case in which the case in which one sector is an even number row (for example, M=10), and a method explained in FIG. 9A is explained as an arrangement method of the error correcting inspection code. Furthermore, in this example, the block E-10 of FIG. 11 is constituted of an even number row of the even-number sector and an even-number row of the odd-number sector.

In this example, the following row arrangement is provided at the linkage of the sectors. The last row as the information data block of the even-number sector is an odd number, and this row is separated to the block E-11 of FIG. 11. Consequently, the last row belongs to the PO-b series. In contrast, the error correcting inspection code of the PO-a series is added to the last row by one row. Next, after the error correcting code of this PO-a series, the error-correcting inspection code of the PO-b series is arranged by one row. The front row of the next odd-number sector is an even number. In this case, this front row belongs to the PO-a series. As a consequence, at the linkage portion between the odd-number sector and the even-number sector, rows of the PO-a, PO-b, and PO-a series are alternately arranged.

Next, an error correcting code PI will be explained.

Figure 18:
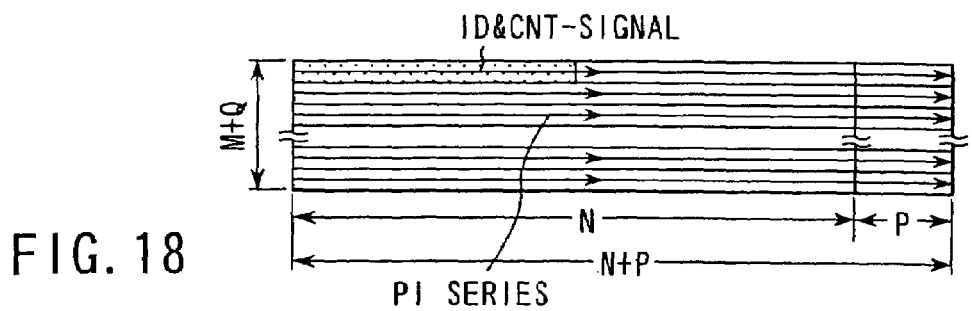
FIG. 18 is a view for explaining a creation example of an error-correcting inspection word PI series.

FIG. 18 is a view showing a formation series of the error correcting inspection word (inner parity) PI which is one example of the present invention which is adopted in the DVD standard. With respect to the data in the column (vertical) direction which is a data transmission order, an inner parity PI is created.

Figure 19:
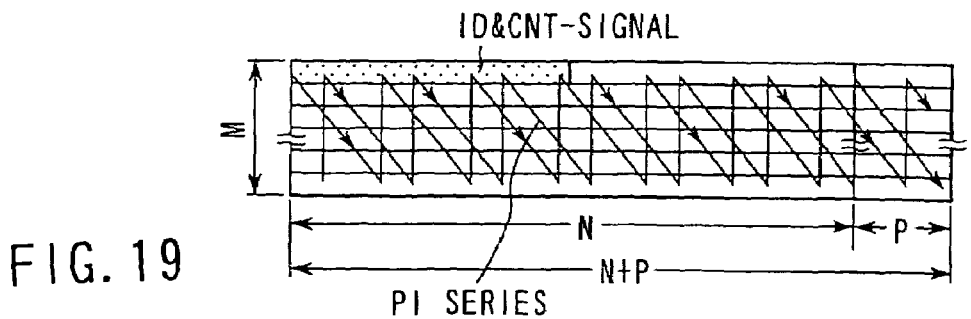
FIG. 19 is a view for explaining another creation example of the error-correcting inspection word PI series according to the present invention.

FIG. 19 is a view showing a variation example for creating an error correcting inspection word (inner parity) PI which is another embodiment of the present invention.

With respect to the M rows×N columns of the information data block, the formation of the Reed Solomon code word (inner parity) PI of (N+P) bytes is realized with the data from the 0 column to the ((N+P)−1) column and from the 0-th row to the (M−1)-th row. In the creation of the error-correcting inspection code of the PI series with respect to the information data block added with the PO, each row and each column are increased by one unit so that the row number (M) which is increased and obtained by 0 row is rotated and arranged to constitute a correction code of the (M) sets of the PI series based on each front row of byte data.

In the conventional recording density, one to two bytes of random errors are scattered, but the error increases to about 5 bytes in a high density recording.

Then, the recording arrangement is not changed with respect to the data order by setting an error correction series to a data set series of an interleave arrangement which is different from the recording order with the result that a small aggregation error is scattered in the error correction processing so that a random error correction capability can be improved in the practice thereof.

Figure 20:
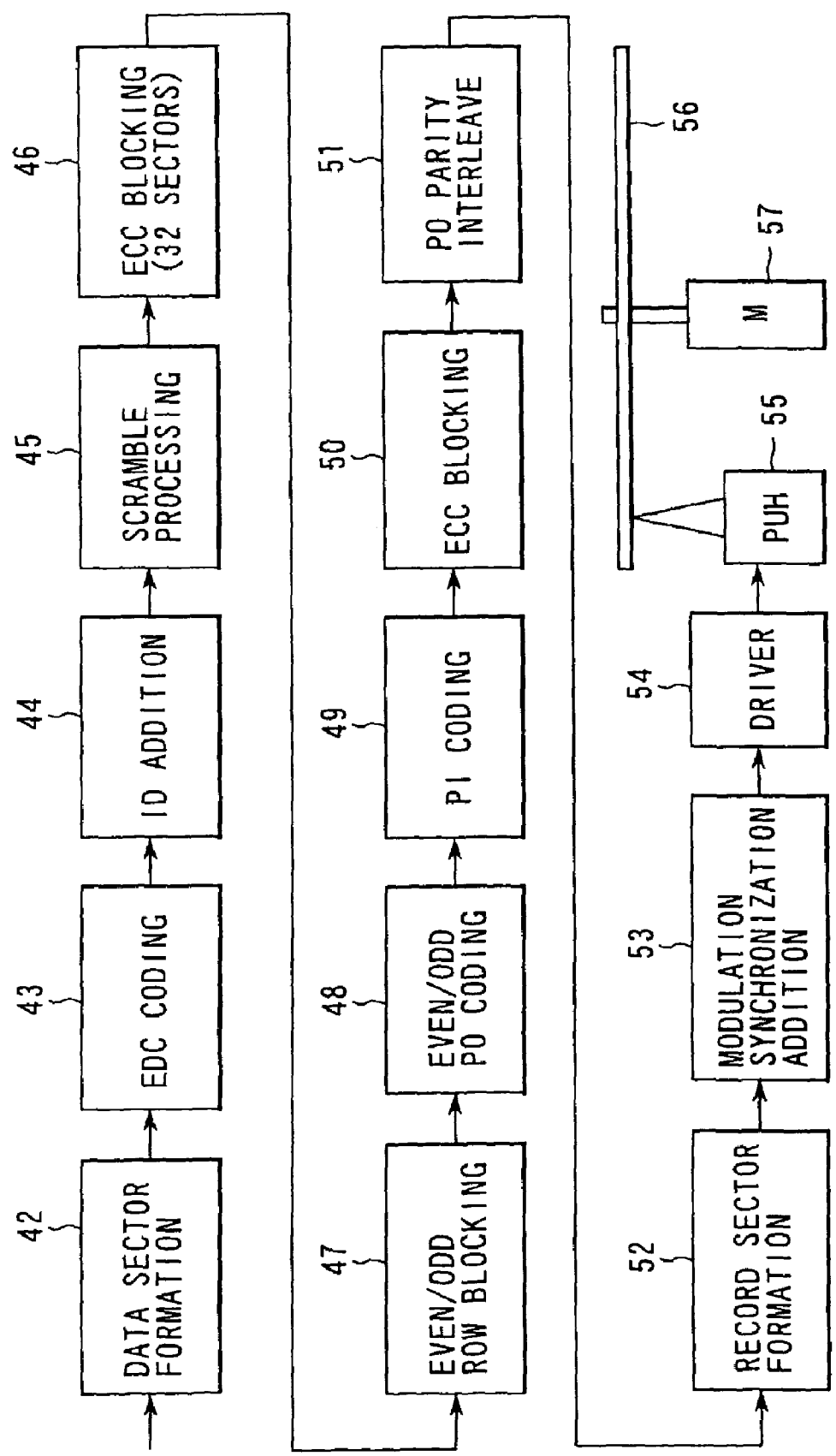
FIG. 20 is an explanatory view showing a creation step and a recording apparatus of an ECC block according to the present invention.

FIG. 20 is a view showing a data processing order of a recording device to which present invention is applied. Data for recording is input to a data sectoring portion 42 from the outside to be sectored. In the embodiment, the 2 k bytes constitute the basic unit. To the 2 k bytes unit data block, an error detecting code (EDC) is added. This data block is referred to as an information data block. This processing is conducted in an EDC coding section 43. Next, the ID for differentiating this information data block (sector) and the other control signal is added at an ID addition section 44. Next, in a scramble processing section 45, the main information data is scrambled and processed.

This scramble processing is conducted for the following reasons. That is, in the case where the main data is an image signal or the lie, "0" continues in the blank portion. When such signal is treated as a record signal, the record signal tends to become a repetition of the same pattern. When the same pattern of the record signal is present in the adjacent track such an optical disk or the like, the servo operation becomes precarious under the influence of the cross talk between tracks. In order to prevent this, the scramble pattern determined by ID is used. For example, the scramble data is overlapped with the data so that the data scramble is conducted.

The scrambled data (sector) is summarized in the unit of 32 sectors in the transmission order to be blocked into an ECC block at an ECC block section 46. This ECC block is input to the even-number/odd-number blocking section 47. Here, the even number and the odd number are temporarily blocked separately. Then, in each block is subject to the error correcting inspection coding of the PO series which has been previously explained at an even-number/odd-number PO coding section 48. Next, the error-correcting inspection coding of the PI series row with respect to each row at a PI coding section 49. Next, at an ECC blocking section 50, the odd-number row and the even-number row blocks are assembled. Furthermore, in a PO parity interleaved section 51, the parity of the PO series is scattered to each sector which has been previously explained while with respect to the overall block the inspection and correction word of the PO series is interleaved to the inspection and correction word of the PO series.

Next, this ECC block is input to a recording sectoring section 52. Furthermore, a synchronous signal is added with the recording sectoring section 52 and a next modulation and synchronous addition section 53 to be subjected to 8/16 modulation. This modulation signal is supplied to an optical pickup 55 via a driver 54 to drive the laser diode. As a consequence, the laser light is irradiated on a disk 56 to conduct signal recording. The disk 56 is rotated and controlled with a disk motor 57.

Figure 21:
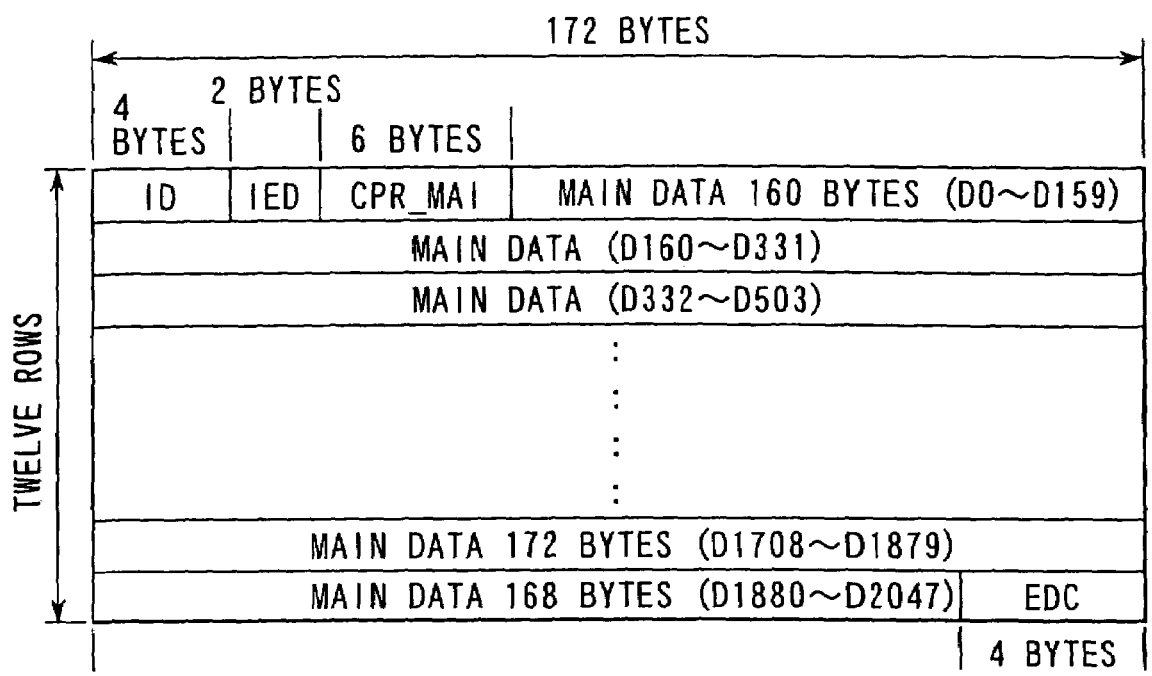
FIG. 21 is an explanatory view showing a data sector structure in a DVD.

FIG. 21 is a view showing a data sector structure in the DVD format created in the midst of the recording processing. The data sector has 172 columns (172 bytes) and 12 rows. The first row comprises an ID (4 bytes), an IED (ID error detection code: 2 bytes), a CPR-MAI (copy right control information: 6 bytes) and a 160 bytes of the main data. At the end of the last row (12th row), the main data and the four bytes error detection code are added. The residual row is all the main data.

Figure 22:
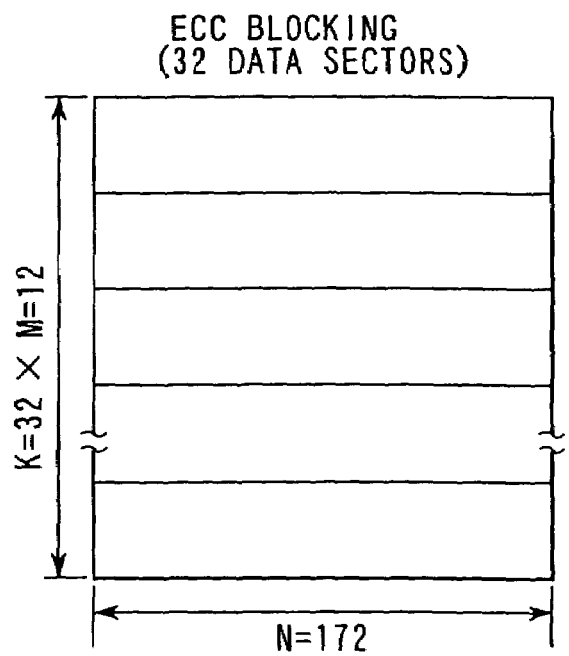
FIG. 22 is an explanatory view showing a state in which the sector according to the present invention is blocked into ECC blocks.

FIG. 22 is a view showing a state in which 32 sectors of FIG. 21 are aggregated to be blocked into ECC blocks.

Figure 23:
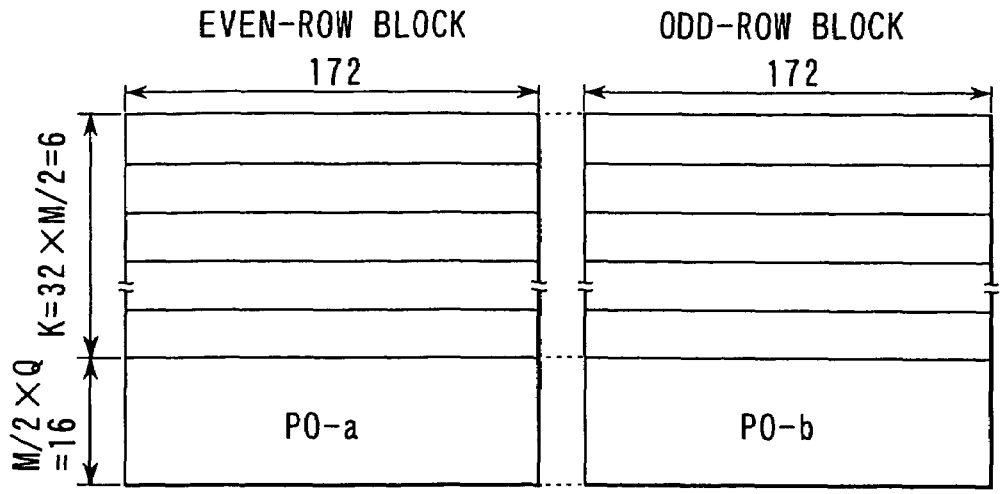
FIG. 23 is an explanatory view showing a state in which the ECC block is divided into two divided blocks which observe the rule of the present invention so that a PO series error-correcting word is added to each of the divided blocks.

In FIG. 23, there is shown a state in which the ECC block of FIG. 22 constitute a block in a rule as explained before, and PO series codes PO-a and PO-b are created and added with respect to respective blocks.

Figure 24:
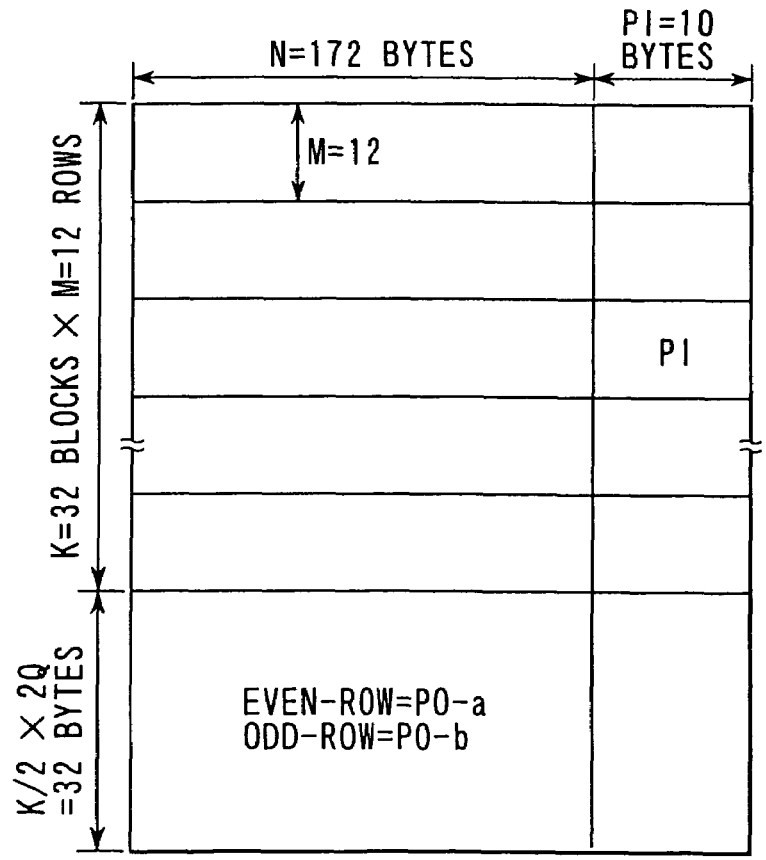
FIG. 24 is a view showing a state in which the two blocks of FIG. 23 are integrated and a PI series error-correcting inspection code is added to the two divided blocks.

In FIG. 24, there is shown a state of a single body ECC block in which the even-number row block and the odd-number row block are both integrated together with the codes PO-a and PO-b. Furthermore, additionally, there is shown a state in which the PI series code is created and added. The arrangement order of PO-a and PO-b is not limited to what is shown in the drawings.

Figure 25:
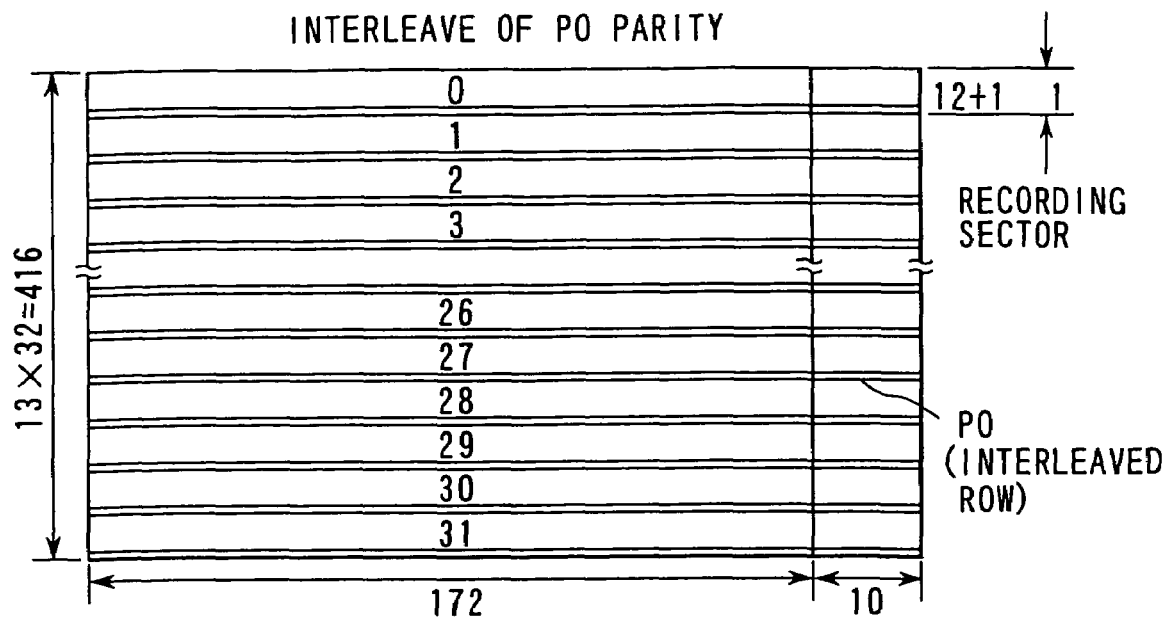
FIG. 25 is an explanatory view showing a state in which the PO series code is interleaved in the ECC block.

FIG. 25 is a view showing a state in which the above PO series code is scattered to each sector. This is the recording sector. To each recording sector, a synchronous signal is added and modulated to be recorded on the recording medium.

Incidentally, in the present invention, in the above explanation, the error correcting inspection code of the PO series is created in the above explanation, and an error correcting inspection code of the PI series is created. However, this processing order is not limited thereto. The processing order may be the reverse thereof. That is, after the data sector is ECC blocked, the PI series error-correcting code is created so that the ECC blocks to which the PI code is added is separated into a block in which the even-number row of the ECC block added with the PI code is aggregated. Thereafter, the PO series error-correcting word including the PI code may be created. Then, after that, the even-number row and the odd-number row are re-aggregated so that, after that, the PO code may be distributed in the interleave processing.

Figure 26:
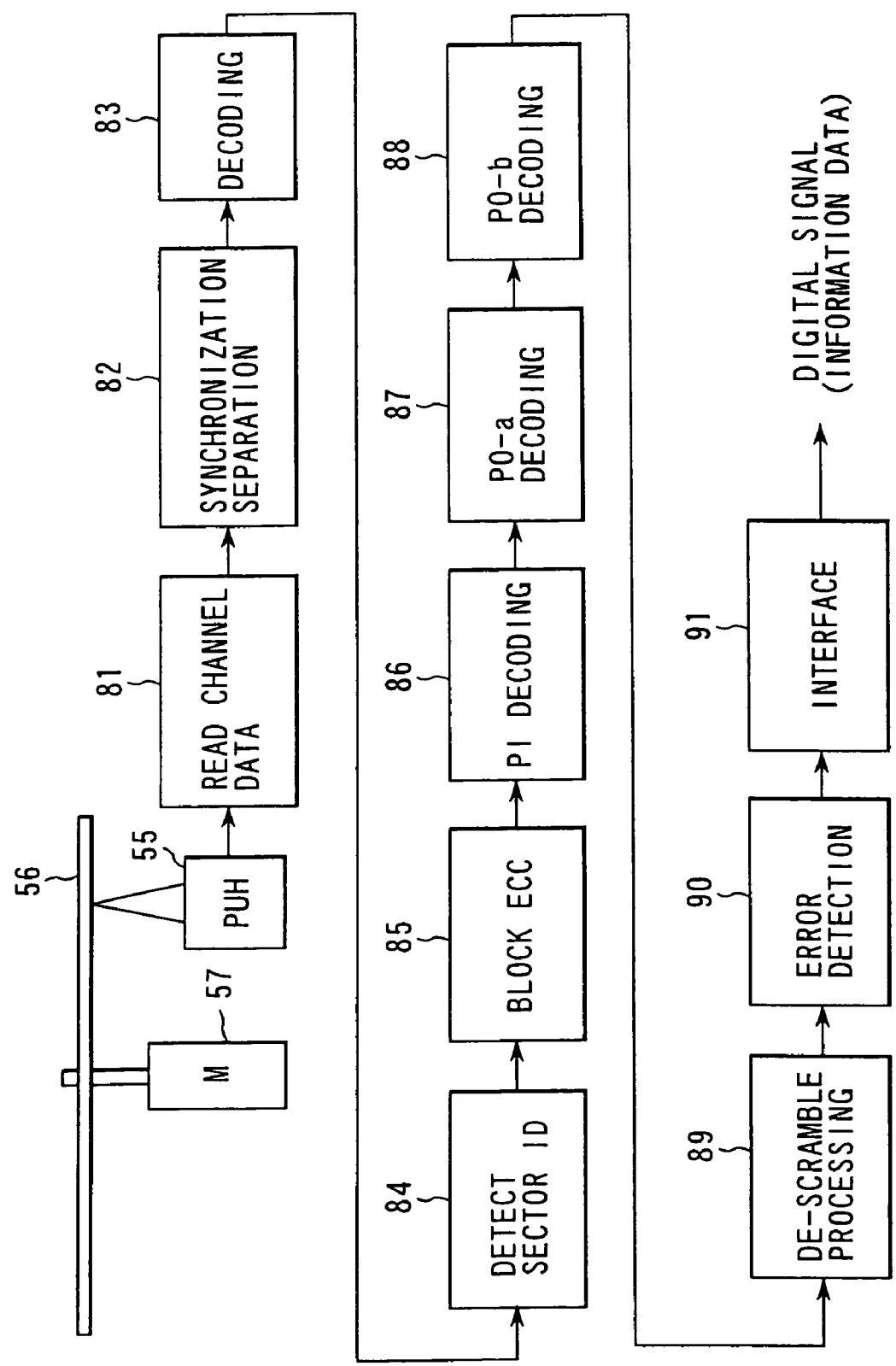
FIG. 26 is a view showing a reproduction apparatus of the ECC block according to the present invention.

FIG. 26 is a view showing an example of a structure of a reproduction apparatus to which the basic of the present invention is applied.

On the disc 56, data is recorded with the recording method as has been explained before. The modulation signal read with the pickup head 55 is supplied to a channel data reading section 81 to provide a channel bit unit. At a synchronous separation section 82, the synchronous signal is separated to be divided in symbol unit. Next, at a demodulation section 83, the data is demodulated into 16 bits to 8 bits data to be supplied to a sector ID detection section 84. Here, the data is differentiated and divided for each sector to be input to an ECC blocking section 85. Here, the sector is aggregated to provide a data in the ECC block unit. The ECC block is input to a PI decoding section 86 to conduct an error detection and correction of the PI series error. Next, at a PO-a decoding section 87, the PO-a series error detection and correction of the PO-a series is conducted, and the error detection and correction of the PO-b series is conducted at a PO-b decoding section 88.

Next, the descramble of the main data portion is conducted at a descramble processing portion 89. Furthermore, at an error detection portion 90, the error detection of the main data section is conducted on the basis of the EDC, and a normal data is taken out. This main data is transmitted to the processing thereafter via an interface 91.

Incidentally, in the reproduction processing, either the PI series error detection correction processing or the PO series error detection processing may be conducted first. The reproduction processing is not limited to the order shown in the drawings.

By the way, in the DVD, the video object (VOB) is designated in the cell unit, and is a format in which VOB includes a plurality of video object units (VOBU). The video object includes a plurality of video packets (V_PCK), and audio packets (A_PCK), and the video objects also allows an inclusion of the auxiliary image packet (SP_PCK). Furthermore, in the recording and reproducing format, at the front of the VOBU, a control packet (RDI_PCK) including real time data information (RDI) is arranged. In this packet, a reproduction start time of the VOBU, the intermediate time at the time of recording, the display control information (aspect ratio information), copy control information and the like. Furthermore, inside of this pack, a reserve area is secured.

Furthermore, the video data stored in the V_PCK is subjected to the compression with the MPEG 1 or MPEG 2 method. In the MPEG 1 or MPEG 2 methods, there is described an information showing an aspect ratio at the sequence header. Furthermore, GOP user data for a line 21 can be inserted into a portion of the compression data. This portion can be used at the time of sending a character code data.

Furthermore, in the DVD standard which enables recording reproduction, a control data area is secured for describing program tune information which determines a reproduction order of the program which is recorded on the user data region.

Consequently, in the case where the ECC block in the form of the present invention, an area of a part of the RDI_PCK described above, or an arrangement portion of the GOP user data, or a part of the control data area is used to store an ECC block differentiation information showing which form the ECC block form takes.

When this ECC block differentiation information is stored, it is possible to differentiate which form of the ECC block record information or the transmitted information take. Consequently, the present invention can be additionally registered with the conventional DVD reproduction apparatus and can be widely applied. Needless to say, a circuit is provided in parallel for processing in the conventional ECC block respectively in the previous recording and reproducing apparatus, so that at the recording time, the user is allowed to arbitrarily adopt either of the processing forms. In this case, the ECC block differentiation information described above is automatically created in accordance with the ECC block selected at the time of recording, and is stored or arranged in a predetermined area.

A method (or a form) for preparing an PI series error inspection code of the present invention is not limited to the above embodiment.

Figure 27:
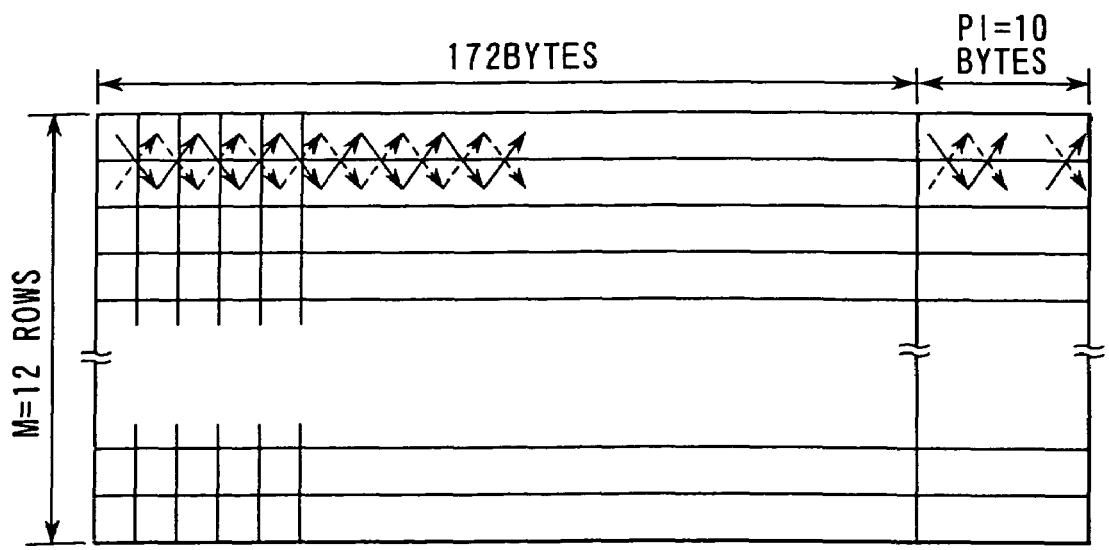
FIG. 27 is a view showing another example of a method for creating a PI series error-correcting inspection code of the ECC block according to the present invention.

In FIG. 27, there is shown a different method for preparing a PI series error correcting inspection code. In this example, there is shown a method for alternately selecting two row data at every two columns to prepare 10 bytes code by using these selected data. When the number of rows is an even-number row, the PI series error correcting inspection code can be easily created with this method. Furthermore, even when a portion of one row data is damaged, the error correcting capability of the PI series can be heightened.

Furthermore, in the above explanation, an explanation is centered on recording an ECC block structure according to the present invention on a recording medium. However, the present invention is not limited to the processing method and apparatus at the time of recording data on the recording medium. In the communication apparatus, the data is picketed to prepare data sector and to aggregate this data sector to transmit the data through modulation processing. In this case, it goes without saying that in the form of the ECC block, the form of the present invention may be adopted. Furthermore, the modulation processing method may not be restricted to the above explanation. In such methods such as QPSK, QAM method or the like, the data in the ECC block is modulated, and furthermore, the data may be transmitted through the transmission channel via the QFDM method.

Furthermore, in the above embodiment, the sector aggregation block of a predetermined unit is divided into an even-number row block and an odd-number row block to create an error-correcting inspection words PO-a and PO-b, but the block may be divided into two or more sectors (Y) to constitute a PO series.

According to the above embodiment, there is provided a data processing method and an apparatus and a reproduction method and an apparatus which is capable of realizing an error correcting processing with a high density optical disk using a blue laser having a short wavelength up to a larger physical error correction length than conventional one.

In order to heighten burst error correction capabilities, errors may be scattered in the error detection and correction capabilities in each correction system. However, as information data, compression coding is provided to the image and sound signal as information data. In a system for conducting recording reproduction of the compression signal, even if the correction incapable signal is generated, data or an error processing system is desired which is capable of suppressing the information breakdown to the least level.

In particular, as a countermeasures against the burst error, a number of errors in the error correction block is decreased so that error correction can be improved. However, even when the error signal is scattered, the scattering of the error correction capabilities leads to the expansion of the damage done on the whole data. Consequently, this is the basic idea for heightening a burst error correction capability. A method for using the error data scattering and data interleave is hard to be adopted.

Thus, this embodiment is devised to an outer parity creation, which has influence directly on the burst error-correcting capability.

Therefore, in this embodiment, one row block is formed by aggregating a plurality of M rows and N columns data sectors. Furthermore, Y sample blocks respectively having the same number of rows are such that one row block is divided and formed. Furthermore, Y error correction inspection word blocks PO-1 through PO-y are created with respect to the data in the row (vertical) direction of the Y sub-blocks. Then, one error correction code block (ECC block) is such that Y error correcting inspection words PO-1 through PO-y are created with respect to the data in the row (vertical) direction of the Y sub-blocks. One error correcting code block (ECC block) is such that Y error correcting inspection word blocks PO-1 and PO-y are scattered and arranged in bytes at the final line. Furthermore, at the end of each row, there is taken a form in which an error correcting inspection word PI in the row (horizontal) direction is added at the end of each row.

Then, according to the present embodiment, the data processing method and apparatus characterized in that the ECC block is constructed is a recording medium on which such ECC block is recorded, and there is provided a method and an apparatus for reproducing the above row block by processing such ECC block.

When described specifically, for example, a data structure is constituted which has a row number twice as long as the maximum byte number of 255 byes which is enabled as the code length of the Reed-Solomon code having 8 bits=1 bytes as data unit. Then, an outer parity is created for each of the rows separately, for example, in the first half even-number row and the latter half odd-number row, and an inner parity is created in the unit of each row.

When such variation error-correcting product code block is adopted, the error data is constituted as being scattered as seen from the outer parity error correction series, so that the actual recording or transmission data observes an actual data order and a structure in which error is not scattered is enabled.

That is, in the error correction method using the conventional error correction product code block, an outer parity and an inner parity are created and added to the a rows×B columns of data block. According to the present invention, as a number of data block row, the row number larger than the maximum code length which enables correction coding is adopted. Then, the error correction inspection coding series (PO series) in the row (vertical) direction is divided into two or more sets. As a consequence, in the present invention, a data block larger than a conventional one can be handled as an error correction product code block. Furthermore, it becomes possible to scatter data transmission order which is important in handling a compression image signal or the like with the result that a large burst error correction capability can be improved.

As described above, in the error correction inspection code by the product code in which, for example, 8 bits=1 byte is set as a data unit, the byte number of the block in which the information data and the error correction inspection code are added, it is required to select the row number and the column number so as to be set to 255 bytes×255 bytes or less.

However, generally, in the information data, a sector structure is formed in which a data amount obtained by adding ID (Identification Data) and considerable amount of control signal to 512, 1024, 2048, 4096 bytes or the like is set as a unit. Then, an error correction block is constituted by aggregating a plurality of such sectors. Furthermore, as a sector number in this error correction block, numeric values such as 8, 16, and 32 is appropriate for the binary digit processing are convenient for taking an alignment with the timing with the other signal processing. When such condition is added, the above row number and the above column number are limited to set the row number and the column number to about 20. In the structure which is one example and is adopted in the conventional DVD standard, 16 sectors are aggregated with 172 bytes×12 bytes being set as one data sector to constitute a data block. Here, 16 bytes outer parity is created with respect to the data of each column (12× 16=192 bytes) so that the outer parity is scattered and added to each row (16) by 1 byte. As a consequence, a data block of 16 sectors which is a block (one sector) of (12+1) row×172 bytes is constituted.

Here, furthermore, 10 bytes inner parity is created and added to each row to constitute an error correction block of (12+1) row×(172+10) column.

With respect to one data sector of 172×12 bytes, the ID, the control signal of 12 bytes and an error detection signal EDC of 4 bytes area inserted into the main data of 2048 bytes. As a consequence, a product code block is realized which enables a high efficient error detection and correction with very small redundancy ratio.

However, under these circumstances, there is a limit to an increase in the number of rows in the row (vertical) direction, and the burst characteristic error correction capability cannot be improved without raising the redundancy ratio.

Therefore, according to the present invention, the error correction block in the DVD standard is provided in two block units, and the even-number row and the odd-number row are divided and treated. Then when an error correcting inspection code PO with respect to each row (vertical) direction of the even-number row and the odd-number row are created, the burst error correcting capability can be improved to two times. Although the error correcting block is provided in the unit of 32 sectors, the block can be used only by correcting only a bit the data reading processing in the processing method. Furthermore, there is an advantage in that the data processing can be used in the conventional sector unit, and can be directly linked to the application standard used in the DVD as it is.

When the present invention is described in the constituent elements;

the digital data processing is conducted in byte unit, and one information data block is constituted in (M×N) bytes of M rows×N columns, in the information data block, data is arranged in bytes, and data is arranged for each row in the data transmission order from the 0th column to the (N−1)-th column and rows from the 0th row to the (M−1)-th row are arranged in the data transmission order;

further a set of the information data block, and a matrix row block of (K×M) rows×N columns constituted of K information data blocks from the 0th information data block to the (K−1)-th which continue in the data transmission order;

in each row of (K×M) bytes of this matrix block, an error correcting inspection word PO-a {(K/2)×Q bytes} is created with respect to (K/2)×(mi+mj) bytes constituted by aggregating the even-number row and the odd-number row designated in the K information data block order and an error correcting inspection word PO-b {(K/2)×Q bytes} is created with respect to (K/2)×(mj+mi) bytes constituted by aggregating the residual odd-number row and the even-number row designated in the K information data block order;

the above PO-a and the above PO-b are scattered and arranged on the K information data block which is constituted of (M×N) bytes of M rows×N columns so that;

each column of the N column is formed as two sets of Reed Solomon code word error correcting inspection code word PO of ((K/2)×(mi+mj)+Q) bytes and ((K/2)×(mj+mi)+Q) bytes {however, M=(mi(number of even-number row)+mj(number of odd-number row)), (Q is an integer of one or more)};

further an error inspection word P bytes is added for each row of N bytes; and as a whole block, an error correcting product code block is realized which constitutes a Reed Solomon error correcting inspection code of (K×(M+Q)×(N+P)) or (K×(M+2Q)×(N+P)) bytes having an information portion of K information data blocks (K×M×N) bytes.

As a consequence, two sets of Reed Solomon code word P in each row in the row direction constitutes an error correcting product code product in which rows constituting respective code rows are alternately arranged.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data processing method, comprising the steps:

configuring digital data into information data blocks of (M×N) bytes in M rows×N columns, so that data is arranged in data transmission order from a 0-th column to the (N−1)-th column for each row while data is arranged in the data transmission order from a 0-th row to an (M−1)-th row;

constructing a first matrix block of ((K/2)×M) rows×N columns, which is constituted of (K/2) information data blocks composed of information data blocks from a 0-th information data block to a ((K/2)−1)-th information data block which continue in the data transmission order;

constructing a second matrix block of ((K/2)×M) rows×N columns, which is constituted of other (K/2) information data blocks which continue in the data transmission order;

constructing a first error-correcting word creation block of (K×(M/2)) rows×N columns by aggregating even-numbered rows of an even-numbered information data block and odd-numbered rows of an odd-numbered information data block to create PO-a in a interleaved manner;

constructing a second error-correcting word creation block of (K×(M/2)) rows×N columns by aggregating odd-numbered rows of the even-numbered information data block and even-numbered rows of the odd-numbered information data block to create PO-b in an interleaved manner;

creating a first error correction word PO-a of ((K/2)×Q) bytes on each column of a first error-correcting word creation block, where Q is an integer of 1;

creating a second error correction word PO-b of ((K-2)×Q) bytes on each column of a second error-correcting word creation block;

scattering and arranging the first and second error correction words PO-a and PO-b into K information data blocks constituted of (M×N) bytes of M rows and N columns in each of said first and second matrix blocks so that each column of N columns is formed as two sets of Reed-Solomon codes PO of (K/2)×((mi+mj)+Q) bytes and (K/2)×((mi+mj)+Q) bytes, where M=mi (the number of even-numbered rows)+mj (the number of odd-numbered rows); and adding a third error-correction word of P bytes for each row of N bytes;

whereby overall error-correcting product code blocks are realized which constitute a (K×(M+Q))×(N+P)) bytes Reed-Solomon code having K information data blocks of (M×N) bytes each as an information portion.

2. The processing method according to claim 1, wherein when M is an even number, Q is 2.

3. A recording medium, wherein an error-correcting product code is recorded with the data processing method according to claim 1.

4. A data processing method comprising a step of transmitting an error-correcting product code constructed with the data processing method according to claim 1.

5. A data reproducing method comprising the steps of:

receiving an error-correcting block constructed with the data processing method according to claim 1;

subjecting the block to rearrangement of rows of the block; and forming the rows to a set of rows in which two sets of Reed-Solomon codes PO are created to carry out each set of error correcting process.

6. A data reproducing apparatus comprising:

error-correcting means for carrying out an error correcting process by receiving the error correcting product code which is constructed in the data processing method according to claim 1; and means for reproducing each row that has been processed with the error processing means at an arrangement position at a time of the error-correcting product code block.

7. A data processing apparatus comprising:

means for configuring digital data into an information data block of (M×N) bytes in M rows×N columns, so that data is arranged in data transmission order from a 0-th column to an (N−1)-th column for each row while data is arranged in the data transmission order from a 0-th row to an (M−1)-th row, means for constructing a first matrix block of ((K/2)×M) rows×N columns, which is constituted of (K/2) information data blocks composed of information data blocks from a 0-th information data block to a ((K/2)−1)-th information data block which continue in the data transmission order;

means for constructing a second matrix block of ((K/2)× M) rows×N columns, which is constituted of other (K/2) information data blocks which continue in the data transmission order;

means for constructing a first error-correction word creation block by aggregating even-numbered rows of an even-numbered information data block and odd-numbered rows of the odd-numbered information data block to create PO-a in an interleaved manner;

means for constructing a second error-correction word creation block by aggregating odd-numbered rows of the even-numbered information data block and even-numbered rows of the odd-numbered information data block to create PO-b in an interleaved manner;

means for creating a first error correction word PO-a of ((K/2)×Q) bytes on each column of ((K/2)×M)) bytes of the first error-correcting word creation block;

means for creating a second error correction word PO-b of ((K/2)×Q) bytes in each column of ((K/2)×M)) bytes of the second error-correcting word creation block;

means for scattering and arranging the first and second error correction words PO-a and PO-b into K information data blocks constituted of (M×N) bytes of M rows and N columns so that each column is formed as two sets of Reed-Solomon codes PO of (K/2)×(mi+mj)+Q) bytes and (K/2)×(mj+mi)+Q) bytes, where M=mi (the number of even-numbered rows)+mj (the number of odd-numbered rows) and Q is an integer of 1 or more; and means for adding an error-correcting word of P bytes for each row of N bytes;

whereby overall error-correcting product code blocks are realized which constitute (K×(M+Q))×(N+P)) bytes Reed-Solomon code having K information data blocks of (M×N) bytes each as an information portion.

* * * * *